United States Patent
Hubbard et al.

(10) Patent No.: US 10,487,526 B2
(45) Date of Patent: *Nov. 26, 2019

(54) MODULAR SEISMIC ISOLATION SUPPORTS AND FLOORS

(71) Applicant: Worksafe Technologies, Valencia, CA (US)

(72) Inventors: Don A. Hubbard, Valencia, CA (US); Gil A. Moreno, San Clemente, CA (US)

(73) Assignee: Workspace Technologies, Valencia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,677

(22) Filed: Nov. 6, 2018

(65) Prior Publication Data

US 2019/0145120 A1 May 16, 2019

Related U.S. Application Data

(63) Continuation of application No. 15/667,368, filed on Aug. 2, 2017, now Pat. No. 10,119,290.

(Continued)

(51) Int. Cl.
*E04H 9/02* (2006.01)
*F24F 7/10* (2006.01)
(Continued)

(52) U.S. Cl.
CPC .............. *E04H 9/023* (2013.01); *E04B 1/36* (2013.01); *E04B 1/98* (2013.01); *E04F 15/02044* (2013.01); *E04F 15/02458* (2013.01); *E04F 15/22* (2013.01); *F24F 7/10* (2013.01); *H05K 7/1495* (2013.01); *H05K 13/00* (2013.01); *E04F 2015/02061* (2013.01); *F24F 2221/40* (2013.01)

(58) Field of Classification Search
CPC ..... E04H 9/23; E04B 1/36; E04B 1/98; E04F 15/024; A47B 47/02; A47B 47/021; A47B 47/028
USPC .......................................................... 52/263
See application file for complete search history.

(56) References Cited

U.S. PATENT DOCUMENTS

| 2,014,643 | A | | 9/1935 | Bakker | |
| 3,468,430 | A | * | 9/1969 | Lawman | A47F 5/14 211/182 |

(Continued)

FOREIGN PATENT DOCUMENTS

WO 2004007871 A2 1/2004

OTHER PUBLICATIONS http://worksafetech.com/wp-content/uploads/2016/06/iso-stand-floor-system-exploded-view.jpg.
International Search Report and Written Opinion, application No. PCT/US17/45151, dated Nov. 9, 2017.

*Primary Examiner* — Paola Agudelo
(74) *Attorney, Agent, or Firm* — Carlos A. Fisher; Stout, Uxa & Buyan, LLP

(57) ABSTRACT

Improved support systems, including seismic isolation platforms, tracks and flooring systems are disclosed for protecting a payload, for example, data center racks containing delicate computer equipment such as a hard disk drive, from damage due to vibrations such as seismic vibrations and the like. The systems are modular in design, and can be assembled and changed quickly, while being strong and robust enough to support heavy loads.

17 Claims, 21 Drawing Sheets

Related U.S. Application Data

(60) Provisional application No. 62/370,192, filed on Aug. 2, 2016.

(51) Int. Cl.

| | | |
|---|---|---|
| *E04B 1/36* | (2006.01) | |
| *E04B 1/98* | (2006.01) | |
| *E04F 15/024* | (2006.01) | |
| *E04F 15/02* | (2006.01) | |
| *E04F 15/22* | (2006.01) | |
| *H05K 7/14* | (2006.01) | |
| *H05K 13/00* | (2006.01) | |

(56) References Cited

U.S. PATENT DOCUMENTS

| | | | |
|---|---|---|---|
| 3,606,704 A | 9/1971 | Denton | |
| 3,924,370 A * | 12/1975 | Cauceglia | E04F 15/0247 52/126.6 |
| 4,050,257 A * | 9/1977 | Parks | E02B 3/068 182/178.1 |
| 4,261,470 A * | 4/1981 | Dolan | F16B 12/36 108/55.1 |
| 4,371,143 A | 2/1983 | Ishida et al. | |
| 4,598,510 A | 7/1986 | Wagner, III | |
| 4,630,417 A | 12/1986 | Collier | |
| 4,662,133 A | 5/1987 | Kondo | |
| 4,676,036 A * | 6/1987 | Bessert | E04F 15/02435 52/126.6 |
| 4,685,258 A * | 8/1987 | Av-Zuk | E04F 15/02452 52/126.6 |
| 4,736,555 A * | 4/1988 | Nagare | E04F 15/02452 248/544 |
| 4,801,122 A | 1/1989 | Stahl | |
| 4,917,211 A | 4/1990 | Yamada et al. | |
| 4,922,670 A | 5/1990 | Naka et al. | |
| 5,409,122 A | 4/1995 | Lazarus | |
| D370,060 S * | 5/1996 | Fahy, Jr. | D25/128 |
| 5,599,106 A | 2/1997 | Kemeny | |
| 5,787,663 A * | 8/1998 | Wehrmann | E04B 5/14 403/217 |
| 5,791,096 A | 8/1998 | Chen | |
| 5,816,559 A | 10/1998 | Fujimoto | |
| 6,324,795 B1 | 12/2001 | Stiles et al. | |
| 6,637,161 B1 * | 10/2003 | Buchalter | E04F 15/02447 52/126.6 |
| 7,290,375 B2 | 11/2007 | Kemeny | |
| 7,784,225 B2 | 8/2010 | Kemeny | |
| 8,104,236 B2 | 1/2012 | Kemeny | |
| 8,156,696 B2 | 4/2012 | Hubbard et al. | |
| 8,342,752 B2 | 1/2013 | Moreno et al. | |
| 8,381,461 B2 * | 2/2013 | Repasky | E04D 11/007 52/126.1 |
| 8,490,234 B2 * | 7/2013 | Rowell | E04F 15/0247 14/2.4 |
| 9,109,357 B2 | 8/2015 | Moreno et al. | |
| 2006/0054767 A1 | 3/2006 | Kemeny | |
| 2010/0154323 A1 * | 6/2010 | Ruland | E04F 15/02447 52/126.6 |
| 2011/0222800 A1 | 9/2011 | Hubbard et al. | |
| 2012/0036796 A1 | 2/2012 | Camilli | |
| 2013/0119224 A1 | 5/2013 | Moreno et al. | |
| 2015/0128510 A1 | 5/2015 | Moreno et al. | |

* cited by examiner

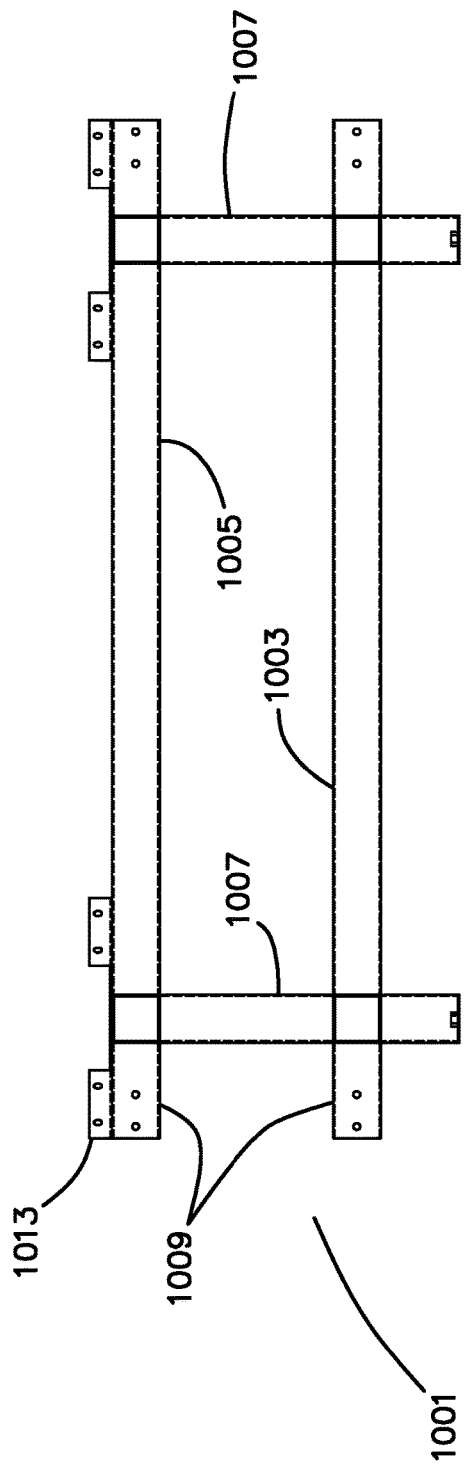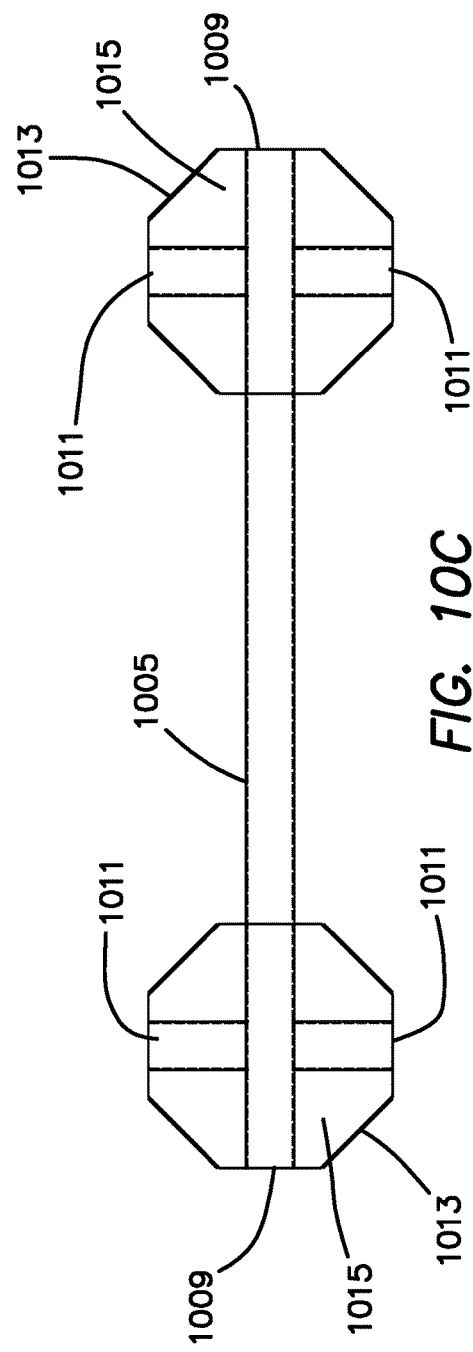

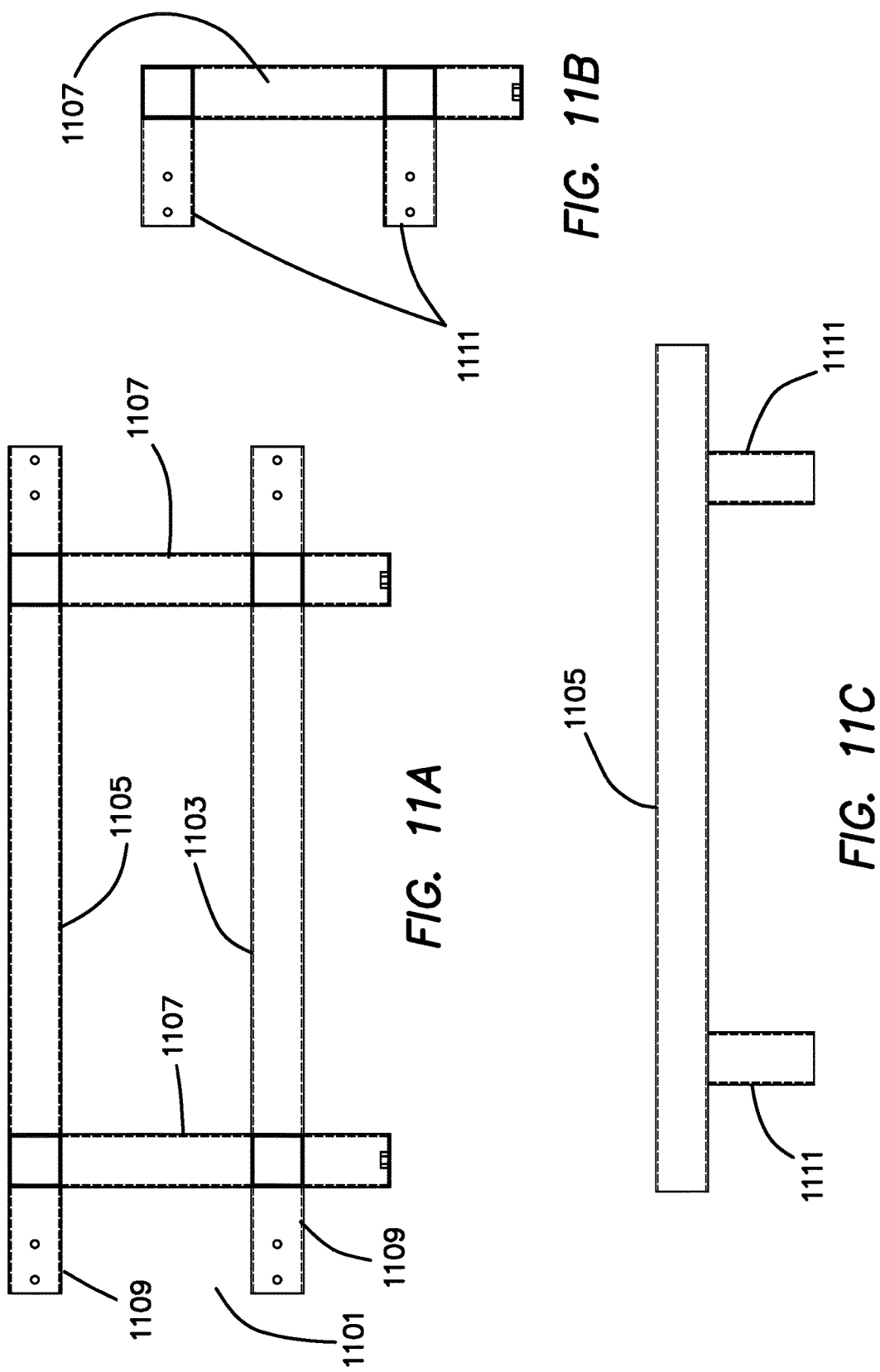

MODULAR SEISMIC ISOLATION SUPPORTS AND FLOORS

CROSS REFERENCE TO RELATED APPLICATIONS

This non-provisional patent application is a continuation of U.S. patent application Ser. No. 15/667,368, now U.S. Pat. No. 10,119,290, filed Aug. 2, 2017 which claimed the benefit pursuant to 25 U.S.C. § 119(e), of provisional patent application Ser. No. 62/370,192, filed Aug. 2, 2016, hereby incorporated by reference herein.

FIELD OF THE INVENTION

The present invention relates, generally, to methods and compositions for isolating and cushioning a payload comprising a computer component from a wide range of vibration amplitudes, for example, from seismic vibrations as well as smaller amplitude vibrations caused by, for example, motorized equipment, air conditioners, heating systems and other vibrations common in data centers, power plants, IT (information technology) centers, and the like.

In preferred aspects the invention is directed, without limitation, to:

modular supports for protection of high weight load concentrations (which can be expressed for a given floor or foundation area as the average load in pounds per square foot) of heavy critical equipment;

modular, seismically isolated, raised-access flooring suitable for the protection of IT racks, server cabinets, other computer-related equipment and articles; electrical equipment such as dynamos and the like; hazardous chemical storage cabinets (thus preventing possible injury, explosion, fire, and the like); art works (such as, without limitation, sculptures and paintings); machinery; people; and the like. Collectively, the objects to be protected against damage or injury by such will be referred to herein as the "payload"; and modular, seismically isolated, raised-access sections of flooring and/or support suitable for the protection of high load concentrations of payload materials.

In preferred examples (although not necessarily every example or embodiment of the invention) the invention of the present invention may comprise isolation bearings, such as seismic and isolation bearings utilizing a rolling member, such as one or more rod, sphere, or ball supported between opposing load bearing surfaces. It will be understood that such a rigid ball may itself be referred to herein as a bearing (for example, a ball bearing), or the combination of the rigid ball and the supporting rigid plates may together be referred to as a bearing. In this description the word "bearing" shall often be reserved for the entire assembly; however, in certain occasions the context may make clear that the sphere or ball itself is referred to as a bearing, such as, without limitation, through the use of terms such as "ball bearing", "rolling bearing" or "spherical bearing".

In one specific example, the invention relates to an isolation bearing in which the load or a portion thereof is concentrated on one or more rounded bearing, such as a ball bearing, placed between opposing bearing surfaces, at least one (and preferably both) of which has a central indentation or depression and wherein a cross-section of the bearing surface comprising at least one shape selected from the group consisting of an arc, one or more straight line having a constant slope, a parabola, other curves, or a combination of any of these. Preferably, the cross-section of the bearing surface comprises a combination of two or more such shapes.

In preferred embodiments, the invention is useful for supporting and stabilizing payloads in data centers, particularly those having hot and/or cold aisles. Since such data centers require substantial floor space to be open so that hot or cold airflow can pass unimpeded, to reduce expense and improve efficiency the remaining floor space is usually packed with a high load density of servers, hard disk drives, and other computing and related equipment. The invention provides a raised floor or section thereof providing ventilation and the provision of services (which may include, without limitation, conduit or cable for electrical power, data transfer, cooling and fire suppression fluids and lighting) to the payload. Due to the robust construction materials, the wider spacing of upright pedestals (e.g., 1200 mm×1200 mm), and the lack of need for cross-bracing between pedestals, such supports permit the support of high load concentrations with more under-floor space than conventional raised floors, while supporting conventional 24 inch or 600 mm floor tiles.

Additionally, the modular nature of the raised flooring supports of the present invention permits the easy installation, rearrangement and addition of equipment and data center space. Units of the flooring supports can be firmly connected to each other at a variety of angles to each other along a floor or foundation to fit the available floor plan, as well as to avoid, for example, vertically extending structural features such as building columns, pipes, conduit and the like. Due to the ease of connecting the modular units of the supports, the system can be reconfigured easily to meet changing requirements.

In particularly preferred examples, the raised floor of the present invention may comprise modular units, which themselves may comprise one or more pair of seismic isolator bearings (hereinafter "isolator"), such as a rolling ball isolator. In currently preferred examples, each modular unit comprises at least two isolators located on a top surface of the modular support unit.

BACKGROUND AND SUMMARY OF THE INVENTION

Isolation bearings are generally used to protect, for example, bridges, buildings, computers, machines, delicate and/or dangerous equipment, and the like from damage due to seismic vibrations. The isolation bearings (and platforms and floors containing such isolation bearings) are typically configured to support a specific load, i.e., the mass and load distribution of the payload being supported.

As one example, given a support surface (such as a floor or platform) having upright support pedestals positioned at the corners of a 600 mm by 600 mm grid, a payload having a specified large mass distributed over a single 600 mm×600 mm (0.36 m²) grid unit is supported by 4 such supports. The same load distributed over a larger surface area (1200 mm×1200 mm, or 4 such grid units) is supported by 9 upright supports; thus, the mass required to be supported by each support in the smaller grid is more than twice (2.25 times in the example above) the mass required to be supported by an individual support in the original surface area.

For this reason, raised flooring systems that are sufficiently strong and robust for early computer rooms and data centers, (in which hot and cold aisles were not designed and almost all the floor space could be used for IT, mainframe, batteries and other computer-related equipment) are often not strong and robust enough for the highly load-concentrated, often multi-tiered rack-mounted payloads in present-day data centers employing hot and/or cold aisle cooling systems. Furthermore, raised flooring systems are typically used to provide ventilation and under-floor space for the provision of services to the supported payload. Such services include, without limitation, conduit or cable for electrical power, data transfer, fluid (such as cooling and fire suppression fluids) and lighting) to the payload.

A typical computer stand or platform is manufactured by California Dynamics Corp. (CalDyne) and marketed as the Type LW Floor Stand: (www.caldyn.com/content/products/computer_room/floor_stands/lw/lw.pdf). This floor stand is a relatively lightly constructed rectangular box, having L-shaped corner supports that appear to be made from a bent steel plate, and a pair of intermediate supports made from steel plate. The top and bottom perimetric frames, and the framework components providing internal support, are made of thinner steel framing material. The corner supports and intermediate supports are fastened to this framing material and to the floor via elastomer-padded foot plates. The foot plates are, in turn anchored into the floor using anchor bolts; in some examples, a spring or elastomeric material may provide dampening against payload damage due to seismic vibrations. The feet can be leveled, i.e. during or after installation, using threaded leveling screws or bolts.

Two approaches have been traditionally utilized to prevent or limit damage or injury to objects or payloads due to seismic events. In the first approach, used particularly with structures themselves, the objects or payload articles are made strong enough to withstand the largest anticipated earthquake. This is the basic approach of the CalDyne Floor Stand and similar raised platforms or flooring systems. However, in addition to the relative inability to predict the extent of damage caused by tremors of high magnitude and long duration and of the directionality of shaking, use of this method alone can be quite expensive and is not necessarily suitable for payloads which are to be housed within a structure. Particularly for delicate, sensitive or easily damaged payload, this approach alone is not especially useful.

In the second approach, the objects are isolated from the vibration such that the objects fail to experience the full force and acceleration of the seismic shock waves. Various methods have been proposed for accomplishing isolation or energy dissipation of a structure or object from seismic tremors, and these methods may depend in some measure on the nature of the object to be isolated.

Thus, particularly for very massive payloads, such as buildings, bridges, and other structures, payloads may be isolated using, for example, passive systems, active systems, or hybrid systems. Such systems may include the use of one or more of a torsional beam device, a lead extrusion device, a flexural beam device, a flexural plate device, and a lead-rubber device; these generally involves the use of specialized connectors that deform and yield during an earthquake. The deformation is focused in specialized devices and damage to other parts of the structure are minimized; however the deformed devices often must be repaired or replaced after the seismic event, and are therefore largely suitable for only one use.

Active control systems require an energy source and computerized control actuators to operate braces or dampers located throughout the structure to be protected. Such active systems are complex, and require service or routine maintenance.

For objects other than such massive payloads, isolation platforms or flooring systems may be preferable to such active or deformable devices. Thus, for protection of delicate or sensitive payloads such as manufacturing or processing equipment, laboratory equipment, battery power plants, computer servers and other hardware, optical equipment and the like an isolation system may provide a simpler, effective, and less maintenance-intensive alternative. Isolation systems are designed to decouple payloads from damage due to the seismic ground motion.

Seismic isolators have a variety of designs. Thus, such systems have generally comprised a combination of some or all of the following features: a sliding plate, a support frame slidably mounted on the plate with low friction elements interposed therebetween, a plurality of springs and/or axial guides disposed horizontally between the support frame and the plate, a floor mounted on the support frame through vertically disposed springs, a number of dampers disposed vertically between the support frame and the floor, and/or a latch means to secure the vertical springs during normal use.

Certain disadvantages to such pre-existing systems include the fact that it is difficult to establish the minimum acceleration at which the latch means is released; it is difficult to reset the latch means after the floor has been released; it may be difficult to restore the floor to its original position after it has moved in the horizontal direction; the dissipative or damping force must be recalibrated to each load; there is a danger of the stand or floor rocking on the vertical springs; and since the transverse rigidity of the vertical springs cannot be ignored with regard to the horizontal springs, the establishment of the horizontal springs and an estimate of their effectiveness, are made difficult.

Ishida et al., U.S. Pat. No. 4,371,143 have proposed a sliding-type isolation floor that comprises length adjustment means for presetting the minimum acceleration required to initiate the isolation effects of the flooring in part by adjusting the length of the springs.

Yamada et al., U.S. Pat. No. 4,917,211 discloses a sliding type seismic isolator comprising a friction device having an upper friction plate and a lower friction plate, the friction plates having a characteristic of Coulomb friction, and horizontally placed springs which reduce a relative displacement and a residual displacement to under a desired value. The upper friction plate comprises a material impregnated with oil, while a lower friction plate comprises a hard chromium or nickel plate.

Stahl (U.S. Pat. No. 4,801,122) discloses a seismic isolator for protecting e.g., art objects, instruments, cases or projecting housing comprising a base plate connected to a floor and a frame. A moving pivoted lever is connected to a spring in the frame and to the base plate. The object is placed on top of the frame. Movement of the foundation and base plate relative to the frame and object causes compression of the lever and extension of the spring, which then exerts a restoring force through a cable anchored to the base plate; initial resistance to inertia is caused due to friction between the base plate and the frame.

Kondo et al., U.S. Pat. No. 4,662,133 describes a floor system for seismic isolation of objects placed thereupon comprising a floor disposed above a foundation, a plurality of support members for supporting the floor in a manner that permits the movement of the floor relative to the foundation in a horizontal direction, and a number of restoring devices comprising springs disposed between the foundation and the floor member. The restoring members comprise two pair of slidable members, each pair of slidable members being movable towards and away from each other wherein each pair of slidable members is disposed at right angles from each other in the horizontal plane.

Stiles et al., U.S. Pat. No. 6,324,795 disclose a seismic isolation system between a floor and a foundation comprising a plurality of ball and socket joints disposed between a floor and a plurality of foundation pads or piers. In this isolation device, the bearing comprises a movable joint attached to a hardened elastomeric material (or a spring); the elastic material is attached on an upper surface of the ball and socket joint and thus sandwiched between the floor and the ball and socket joint; the bearing thus tilts in relation to the floor in response to vertical movement. The floor is therefore able to adjust to buckling pressure due to distortion of the ground beneath the foundation piers. However, the device disclosed is not designed to move horizontally in an acceleration-resisting manner.

Fujimoto, U.S. Pat. No. 5,816,559 discloses a seismic isolation device quite similar to that of Kondo, as well as various other devices including one in which a rolling ball is disposed within the tip of a strut projecting downward from the floor in a manner similar to that of a ball point pen.

Bakker, U.S. Pat. No. 2,014,643, is drawn to a balance block for buildings comprising opposed inner concave surfaces with a bearing ball positioned between the surfaces to support the weight of a building superstructure.

Kemeny, U.S. Pat. No. 5,599,106 discloses ball-in-cone bearings.

Kemeny, U.S. Pat. Nos. 7,784,225 and 8,104,236 discloses seismic isolation platforms containing rolling ball isolation bearings.

Hubbard and Moreno, U.S. Pat. Nos. 8,156,696 and 8,511,004 discloses apparatus and methods involving raised access flooring structure for isolation of a payload placed thereupon.

Moreno and Hubbard, U.S. Pat. No. 8,342,752 disclose isolation bearing restraint devices.

Isolation bearings are disclosed in Hubbard and Moreno, U.S. Patent Publication US 2013/0119224 filed on Sep. 25, 2012.

Moreno and Hubbard, U.S. Patent Publication No. U.S. 2011/0222800 discloses methods and compositions for isolating a payload from vibration.

Moreno and Hubbard, U.S. Pat. No. 9,109,357 B2 discloses modular isolation systems and preferred seismic isolation systems not having a raised floor structure, but rather having a low profile permitting the resulting seismic isolators to be substantially level with, or slightly above, the existing flooring surrounding structure.

Moreno and Hubbard U.S. Patent Publication No. US 2015/0128510 A1 describes polygonal seismic isolation bearings.

Hubbard and Moreno, U.S. Provisional Patent Application Nos. 62/079,475, 62/262,816 and 62/335,203 describe seismic isolation of container transport and storage systems.

Moreno and Hubbard, U.S. Provisional Patent Application Ser. No. 62/346,182, filed Jun. 6, 2016 and entitled "Seismic Isolation Systems Comprising A Load-Bearing Surface Having A Polymeric Material" describes isolators having a polymeric coating.

Chen, U.S. Pat. No. 5,791,096 discloses a raised floor system.

Denton, U.S. Pat. No. 3,606,704 discloses an elevated floor structure suitable for missile launching installations with vertically compressible spring units to accommodate vertical displacements of the subfloor.

Naka, U.S. Pat. No. 4,922,670 is drawn to a raised double flooring structure which is resistant to deformation under load. The floor employs columnar leg members that contain a pivot mounting near the floor surface, which permits to floor to disperse a load in response to a side load.

All patents, patent applications and other publications cited in this patent application are hereby individually incorporated by reference in their entirety as part of this disclosure, regardless whether any specific citation is expressly indicated as incorporated by reference or not.

The conservative character of a seismic isolation bearing may be described in terms of the bearing's ability to absorb displacement energy against the gravitational force caused by seismic activity or other external applied forces, and thus to cushion the structure being supported from such displacement. In this regard, features such as a rubber bearing body, leaf spring, coil spring, or the like may be employed to urge the bearing back to its original, nominal position following a lateral displacement caused by an externally applied force such as a seismic tremor. In this context, the bearing "conserves" lateral displacement energy by storing a substantial portion of the applied energy, and releases this stored energy upon cessation of the externally applied force to pull or otherwise urge the bearing back to its nominal original position.

Certain isolation bearings may have a laminated rubber bearing body, reinforced with steel plates. More particularly, thin steel plates may be interposed between relatively thick rubber plates, to produce an alternating steel/rubber laminated bearing body. The use of a thin steel plate between each rubber plate in the stack helps prevent the rubber from bulging outwardly at its perimeter in response to applied vertical bearing stresses. This arrangement permits the bearing body to support vertical forces much greater than would otherwise be supportable by an equal volume of rubber without the use of steel plates.

Other isolation bearings may comprise steel coil springs combined with snubbers (i.e., shock absorbers). These bearings are often used to vertically support the weight of the payload. Coil springs, described in International Patent Publication WO 2004/007871, are generally preferable to steel/rubber laminates in applications where the structure to be supported may undergo an upward vertical force, which might otherwise tend to separate the steel/rubber laminate. Rubber bearings are typically constructed of high damping rubber, or are otherwise supplemented with lead or steel yielders useful in dissipating applied energy.

Metallic yielders, however, are disadvantageous in that they inhibit or even prevent effective vertical isolation, particularly in assemblies wherein the metallic yielder is connected to both an upper bearing plate and an oppositely disposed lower bearing plate within which the rubber bearing body is sandwiched.

Steel spring mounts of the type typically used in conjunction with the isolation of payloads comprising apparatus and/or machines are generally unable to provide adequate energy dissipation, with the effect that such steel spring mounts generally result in wide bearing movements or oscillations. Such wide bearing movements may be compensated for through the use of snubbers or shock absorbers to aid in absorbing the energy of the lateral displacement. However, in use, the snubber may impart to the bearing an acceleration on the order of, or even greater than, the acceleration applied to the machine due to seismic activity alone.

In another example, an isolation bearing may comprise a lower plate having a concave (having an arc-shaped cross sectional portion) shaped cavity and an upper plate having a substantially identical cavity with a rigid ball placed therebetween.

In yet another example, such a seismic isolation device includes a bearing comprising a lower plate having a parabolic shaped cavity and an upper plate having a substantially identical cavity with a rigid ball placed therebetween.

Isolation platforms having seismic bearings containing a variety of differently shaped load bearing surfaces are disclosed in e.g., International Patent Publication No. WO/2004/007871 and US 2006/0054767; Isolation platforms comprising floors are disclosed in e.g., U.S. Pat. No. 7,290,375. Each of these publications and patents, and every other patent, patent application, and publication cited in this patent application, is expressly and individually incorporated by reference herein in its entirety as part of this specification.

Isolation bearings of the "rolling ball" type may in general include a lower plate having, without limitation, a conical, concave or parabolic shaped cavity, or a combination of linear and curved shapes in cross-section; a cavity having a region of constant or variable slope and an upper plate which may be different from, or preferably identical to, the lower plate, with a rigid ball or other rolling member (such as one or more cylindrical rod, placed therebetween. The lower plate rests or is fixed or placed on the ground, foundation, platform, support, floor or base surface, while the payload to be supported rests directly or indirectly on the top surface of the upper plate, or the platform or surface which is supported by the isolation bearing or bearings. In this way, when external vibrations such as seismic movements occur the lower plate moves relative to the upper plate via the rolling of the spherical ball between the upper and lower plates.

There is therefore a continuing need for isolation systems, including isolation platforms and isolation floors, that are strong, robust, and stable (i.e., have a reduced tendency to collapse or come apart in use), and which can withstand high weight concentrations of payloads such as, without limitation, information technology (IT) equipment, data center computer equipment, racks containing such equipment, which may include servers, hard disk drives (HDD), batteries for backup power, and the like, and absorb both large seismic shocks and smaller amplitude vibrations. Preferably the isolation systems are also quickly easily integrated into the locations in which they are desired to be installed.

There is also a need for isolation platforms and flooring systems which are both modular and standardized, and yet able to be quickly assembled and flexible enough to be partly or completely reconfigured to meet changing layout requirements. For example, U.S. Patent Publication No. US 2015/0128510 A1 and U.S. Provisional Patent Application Ser. No. 62/346,182, filed Jun. 6, 2016 describe seismic isolation bearings having, in a top view a non-rectangular polygonal frame or border containing fastener fittings (such as, without limitation, pins and/or bolt holes), which easily permits the quick, firm attachment of framing elements to the isolation bearings at a variety of angles. This allows the customizable assembly of isolation racks, supports and flooring to suit a large variety of floor plans, including "curved" and other non-standard floor plans. Additionally, the use of polygonal fittings isolation bearings permits the easy design of a floorplan that accommodates vertically extending features such as building columns pipes, conduit, and the like.

BRIEF DESCRIPTION OF THE DRAWINGS

FIG. 10A is a front view of a two-isolator modular seismic support unit, showing upper and lower support frame elements and the lower isolator mount on top thereof. The isolator bearing is not shown.

FIG. 10C is a top view of the two-isolator modular seismic support unit shown in FIG. 10A.

FIG. 11A is a front view of a modular seismic support end unit, showing upper and lower support frame elements, and without showing the lower isolator mount. The isolator bearing is not shown.

FIG. 11B is a side view of the modular seismic support unit shown in FIG. 11A.

FIG. 11C is a top view of the modular seismic support unit shown in FIG. 11A.

DETAILED DESCRIPTION OF THE INVENTION

Figure 1:
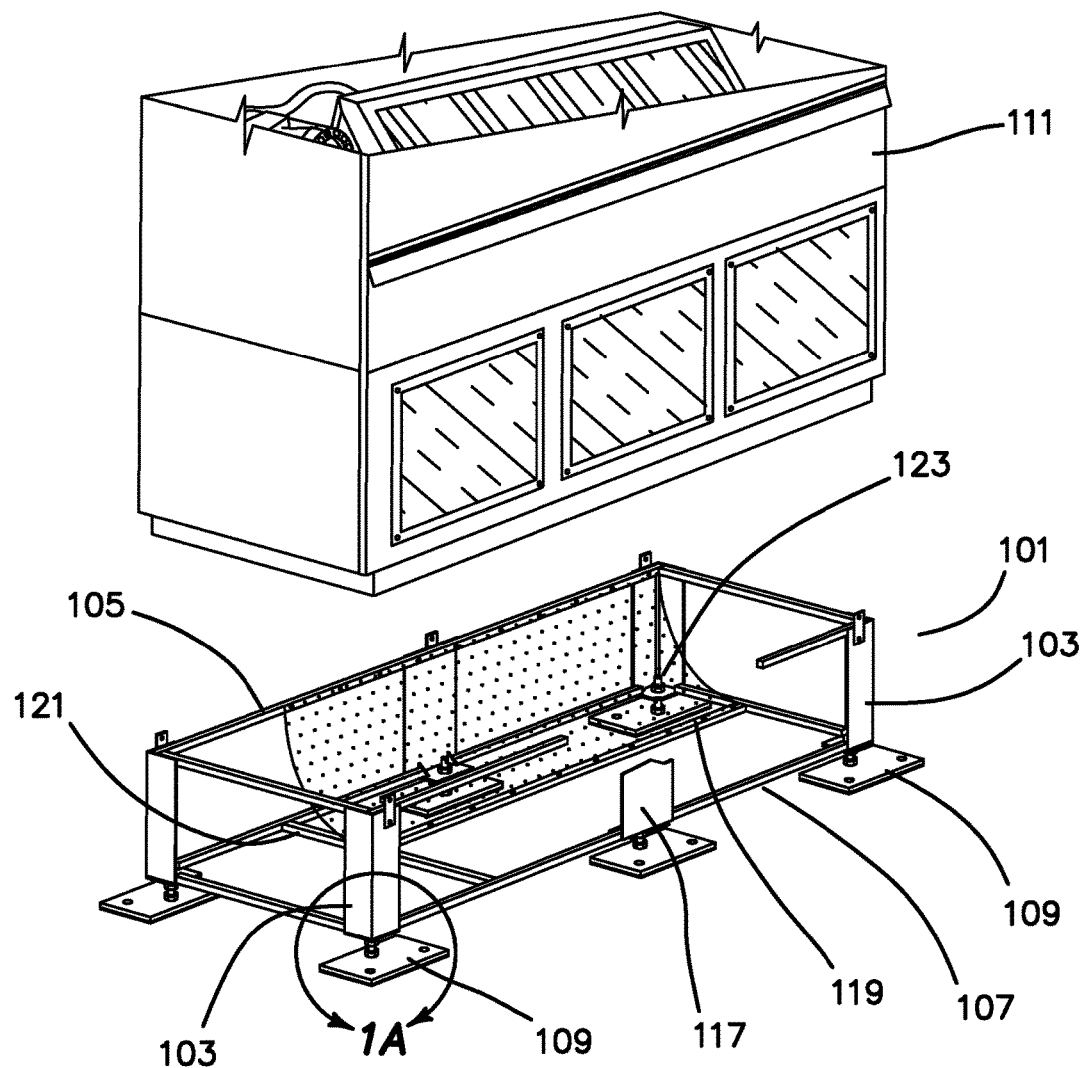
FIG. 1 is an exploded view of a prior art seismic equipment stand showing computer equipment fitted to and lowered onto the stand.

Seismic isolation systems were originally used primarily to isolate and protect buildings, bridges, and other large structures from damage and failure due to seismic shock. More recently, seismic isolation techniques have been applied to the protection of delicate equipment such as laboratory equipment and computer components; for example, computer, power, and telecommunications components contained in corporate or university data centers, large scale IT facilities, sophisticated computer modeling facilities, e-mail and internet servers, motion picture studios having digital animation and special effects capabilities, and the like.

The seismic isolation systems of the present invention are designed to support weight load concentrations of such payloads, in particular, but without limitation, computer and information technology-related equipment in high weight density IT equipment racks, with ease of flexibility and expandability when a data room or data center is reconfigured.

The use of data centers has grown as a response to the increasing demand for computer processing capability and a recognition of the importance of IT in the place of every business and organization today. Whereas smaller organizations have sufficient processing power with laptops, PCs and occasionally servers, larger organizations require higher capacity centralized processing to serve a wide range of needs and applications. A few years ago this capacity was supplied by large mainframe computers, but more recently the method used has been to provide data centers comprising many networked computer servers known as "blades" installed in racks. Such racks enable controlled and modular expansion of capacity. The racks may also house telecommunications equipment such as routers to handle data flow between the computer servers and data flow between the data center and the outside world.

Data centers can mirror the growth and business activities of successful companies. The growth of a data center within in an expanding company may proceed in a manner such as follows:

1. Initially the data centre may start as single rack of servers in an air-conditioned room—sometimes referred to as a "data closet".
2. As the organization expands the number of IT racks employed increase, the closets become "server rooms" or "IT rooms".
3. Eventually the number of racks and size of room expands, often to the point where a dedicated building or part of a building houses the IT. Whilst there is no strict definition of when the size of an IT facility becomes large or sophisticated enough to be termed a "data center", data centers are typically relatively large IT facilities. Typically, there will be more than 50 servers (often many more) and at least some redundancy in the power supply powering the servers to ensure continuity of service.
4. As the company grows and/or becomes a multi-national organization additional data centers may be built and sometimes a number of such data centers will be consolidated into "super data centers".
5.

Data center facilities can require a floor space ranging from a few hundred square feet to a million square feet. The most prevalent size for a small data center is five to ten thousand square feet with fifty to a hundred thousand square feet being the most common floor area requirement for a large data center. Data centers will typically have the ability to deliver applications spread across an organization and/or supply chain and/or customers in differing geographical locations. There will typically be a dedicated mechanical and electrical (M&E) plant to deliver power, cooling and fire suppression with built-in redundancy with the aim of providing near continuous operation.

The IT industry has long recognized the criticality of central computing facilities and the need for energy efficient operations to control costs. One key problem common to data centers and IT facilities is how to cool a data center effectively and efficiently. As a data center grows over time the following progression may occur.

1. A building is created, or a room within a building is allocated to housing information technology equipment, which is powered by a dedicated conditioned ("clean") power line, and the building's air conditioning system is adjusted to cool that room.
2. As the data room grows in scale, server/IT equipment racks are laid out in rows; increased computing equipment results in more heat being produced. Consequently, increased ventilation and air conditioning is required. Typically CRAC (Computer Room Air Conditioning) units are added to the end of the rows to provide the cooling. Air produced by these units is entrained through a raised floor and exits through floor grilles at the front of the server rack rows. The equipment installed in the racks may contain integral fans which draw the cooled air from the front across the circuitry, and heat is exhausted via vents in the products to the rear. The separation created by these server racks creates a 'hot aisle' into which air is expelled by the IT products in the racks and a 'cold aisle' from which cooler air is drawn into and through the IT products by their integral fans. In order to compensate for the loss of floor space required by the creation of these hot aisles and cold aisles, the racks may be made to hold more and/or heavier IT equipment, which increases the load density on the floor and any equipment support rack.

Such arrangements of multitiered racks of IT equipment present particular problems in the seismic protection of such equipment in modern high-density data centers. While conventional raised seismic floors and seismic equipment platforms are often suitable for the placement of computer equipment in smaller or conventional computer rooms, such conventional seismic floors and supports are not strong enough for the increased weight loads of server racks in these modern data centers.

Additionally, as can be seen from the summary above, it is often necessary to reconfigure the arrangement of IT equipment as result of expanding data needs, equipment cooling requirements, and efforts to maximize efficiency. Conventional raised flooring (and seismic support isolation systems based upon such conventional raised flooring) is generally not strong enough to reliability support the high weight density IT equipment racks now increasingly used. Additionally, the reconfiguration of raised isolation flooring, or the addition of new raised flooring segments is problematic, particularly since such flooring commonly requires the maintenance of a "moat" or gap between the flooring edge and the wall of the room in which it is contained. This moat permits movement of the isolation flooring relative to the foundation during a seismic vibration; no new flooring can be built or permitted to project into this moat area.

The present invention solves these problems. Seismic isolation supports and seismic flooring are made using solid, rigid metal girders or rigid hollow metal tubing, preferably square steel tubing. The isolation supports may be used without a seismic isolator if desired, but can be modularly reconfigured to easily accommodate the installation of isolators in the future.

In one basic example, the present invention is drawn to a modular system for supporting a payload. This system involves the use of a plurality of modular support units, also called "aisle base stands" herein, connected to each other using connectors, also called "aisle base stand connectors" herein. Typically, the aisle base stand has two vertically extending connectors and at least two horizontal connectors joining the vertically extending connectors. However in certain examples the present invention may have any number of vertically extending connectors from 1 to 6, and similarly, the number of horizontal connectors may be from 1 to about 6, with at least 2 being most preferred.

In a preferred example, the vertically extending connectors join the horizontal connectors at, or substantially at, a 90° angle; however, those of ordinary skill in the art will recognize that the vertically extending connectors may meet the vertically extending connectors at any of a variety of angles; for example, the angles between vertically extending and horizontal connectors may be between about 45° and about 90°. It will also be understood that by "vertically extending" is meant a first end of the connector extends above a horizontal plane touching an upper surface the second, opposing end of the connector. Similarly, "horizontal" connectors means that, when in place as part of the equipment support system the horizontal members are arranged within about 20° of the horizontal.

The vertically extending connectors may be joined to the horizontal connectors in any manner effective to prevent their disconnection during use. Thus, for example, the horizontally extending connectors may be welded to the vertically extending connectors. In a preferred example the horizontally members may have holes through which the vertically extending connectors may be joined thereto by, for example, bolts, rivets, or welds.

In an important feature of this and similar examples of the invention, the modular support units of the present invention are configured to be firmly and strongly joined to other framework elements (such as other steel tubing connectors) and/or other modular support units. For example, when the modular support unit comprises two vertically extending connectors, the modular support unit is configured to easily be connected to another modular support unit comprising at least one vertically extending unit, wherein each of the vertically extending connectors is a leg upon which the equipment may rest, thereby creating a stable equipment stand comprising three or more legs. The legs can be leveled, i.e. during or after installation, using threaded leveling screws or bolts.

Figure 10B:
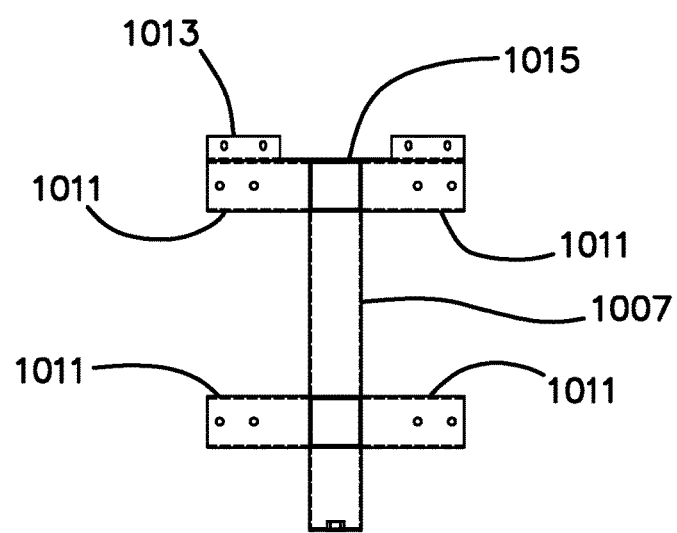
FIG. 10B is a side view of the two-isolator modular seismic support unit shown in FIG. 10A.

In preferred examples, the modular support unit is configured to be connected to another modular support unit by virtue of mating components extending a short distance, for example, horizontally forward and/or backward therefrom, and laterally to one side therefrom. In these examples, these mating components are structured to have a slightly larger opening than an end of a aisle base stand connector, for example, as shown in e.g., FIG. 12A-FIG. 12F, so as to permit the end of the aisle base connector to be inserted into and fastened to the mating component. In FIG. 10A-10C the mating components are seen as parts or extensions of the horizontal connector(s), and the forward-facing and backward-facing mating components are arranged at right angles to, and on the same horizontal plane to, the laterally facing mating components. In these latter Figures the mating components comprise open ends of hollow square tubing (in this case, 3 inches×3 inches), while FIG. 12A-FIG. 12F show complementary ends of the aisle base stand connectors, having a smaller perimeter (2.720 inches×2.720 inches).

One of ordinary skill in the art is aware that there are myriad different shapes, sizes and materials from which the mating components can be made, and the aisle base connector may be attached thereto. Such a person is also aware that the mating components of the present invention may be configured at 90° angles to each other, as shown in FIG. 10A-10C, or may be configured at any other angles (such as 45°, 22.5° and the like) to suit the necessary flexibility for installation of the invention.

Additionally, the person of ordinary skill in the art recognizes that the mating components may be joined to the modular support unit in any effective manner; thus in addition to the extensions of the hollow square tubing should in the figures, mating connectors may, for example, be joined to the modular support unit as a collar affixed to the vertically extending connectors, or the horizontal connectors and configured to mate with and be connected to aisle base connectors.

Functionally, the modular support units may be joined together to define a raised equipment support or floor. Advantageously, the raised support or floor of the present invention is substantially more robust, and stronger, than commonly used raised flooring, which is not designed or structured to support highly concentrated payloads such as data center IT equipment racks. Additionally, in preferred examples, the "box-like" structure and height of the support or floor provides superior access to the under-floor space, for the placement or retrofitting of services such as electricity, fluids, coolant, data transfer lines, and the like, as compared to conventional raised flooring.

Figure 14:
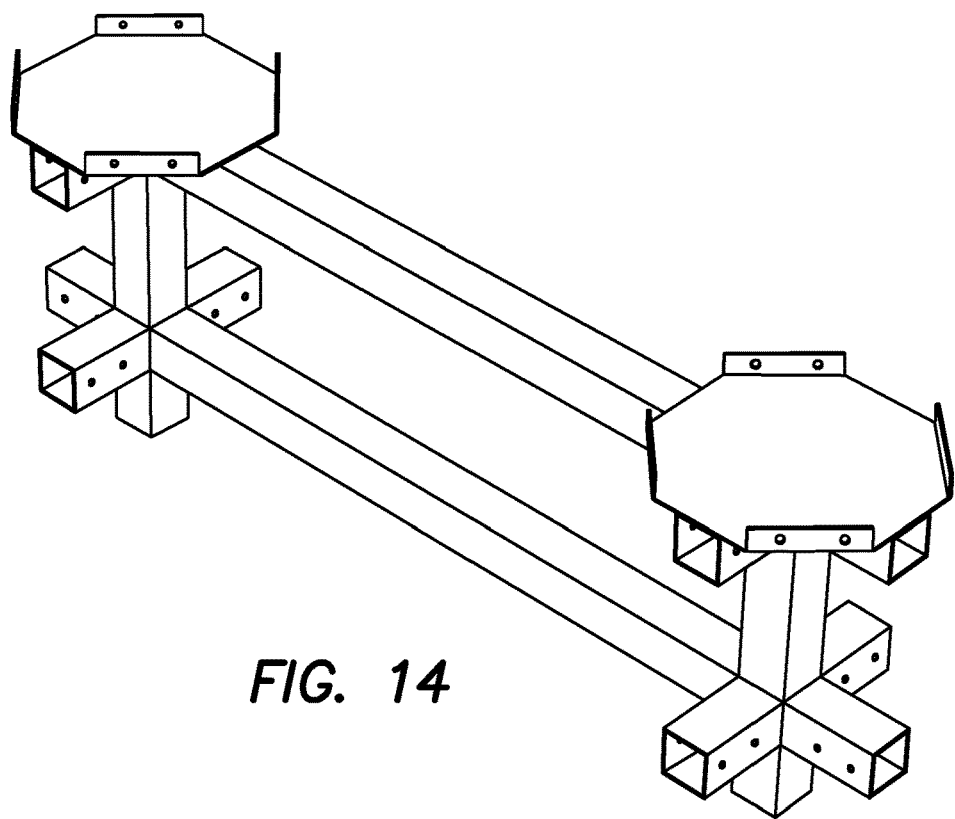
FIG. 14 is a perspective rendering of an modular seismic support unit having two seismic isolator mounts, as shown in FIGS. 10A, 10B and 10C.
Figure 15:
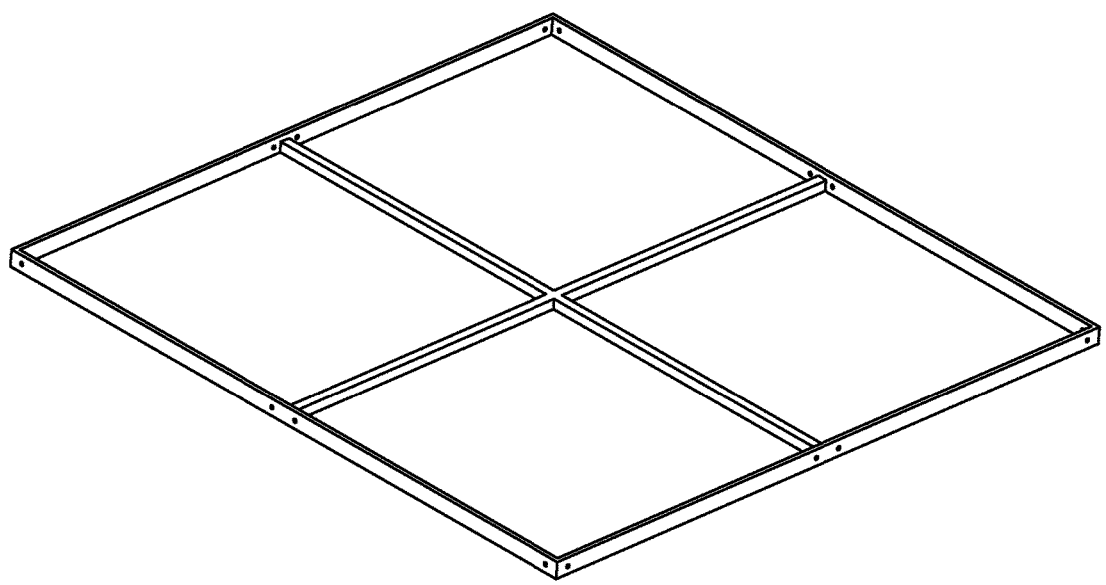
FIG. 15 is a perspective rendering of a support platform similar to that shown on FIG. 9.
Figure 16:
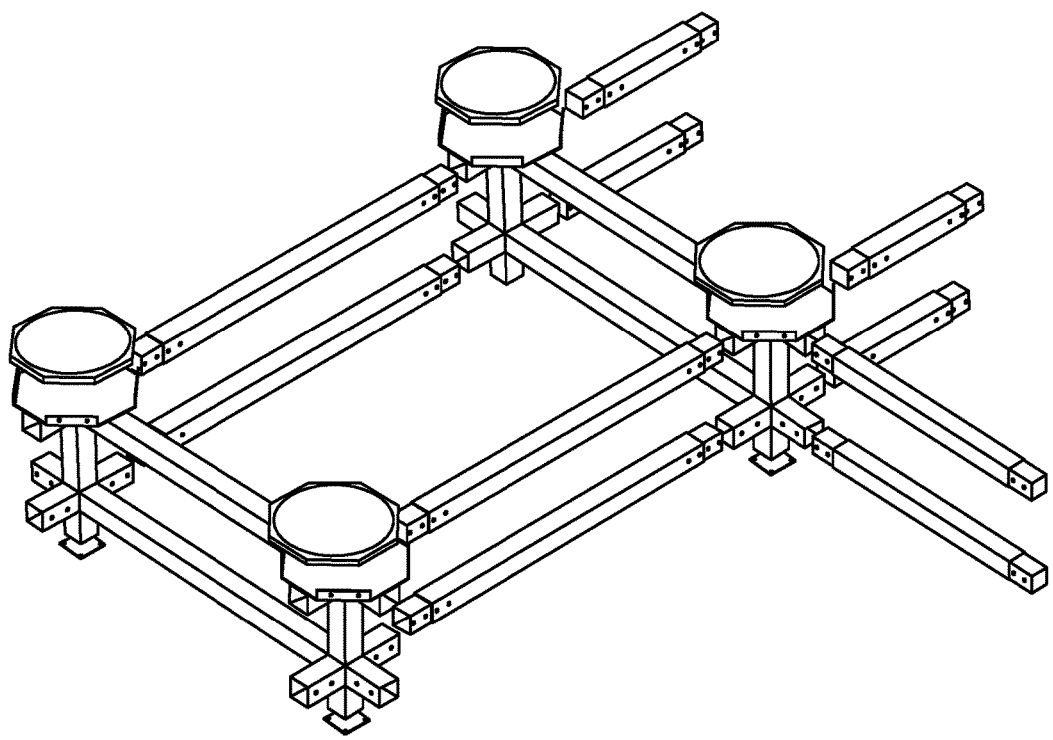
FIG. 16 is a partially exploded perspective rendering showing upper and lower aisle base stand connectors linking two modular seismic support units, such as the modular seismic support unit shown in FIG. 14, one of which also is fitted with additional aisle base stand connectors.
Figure 17:
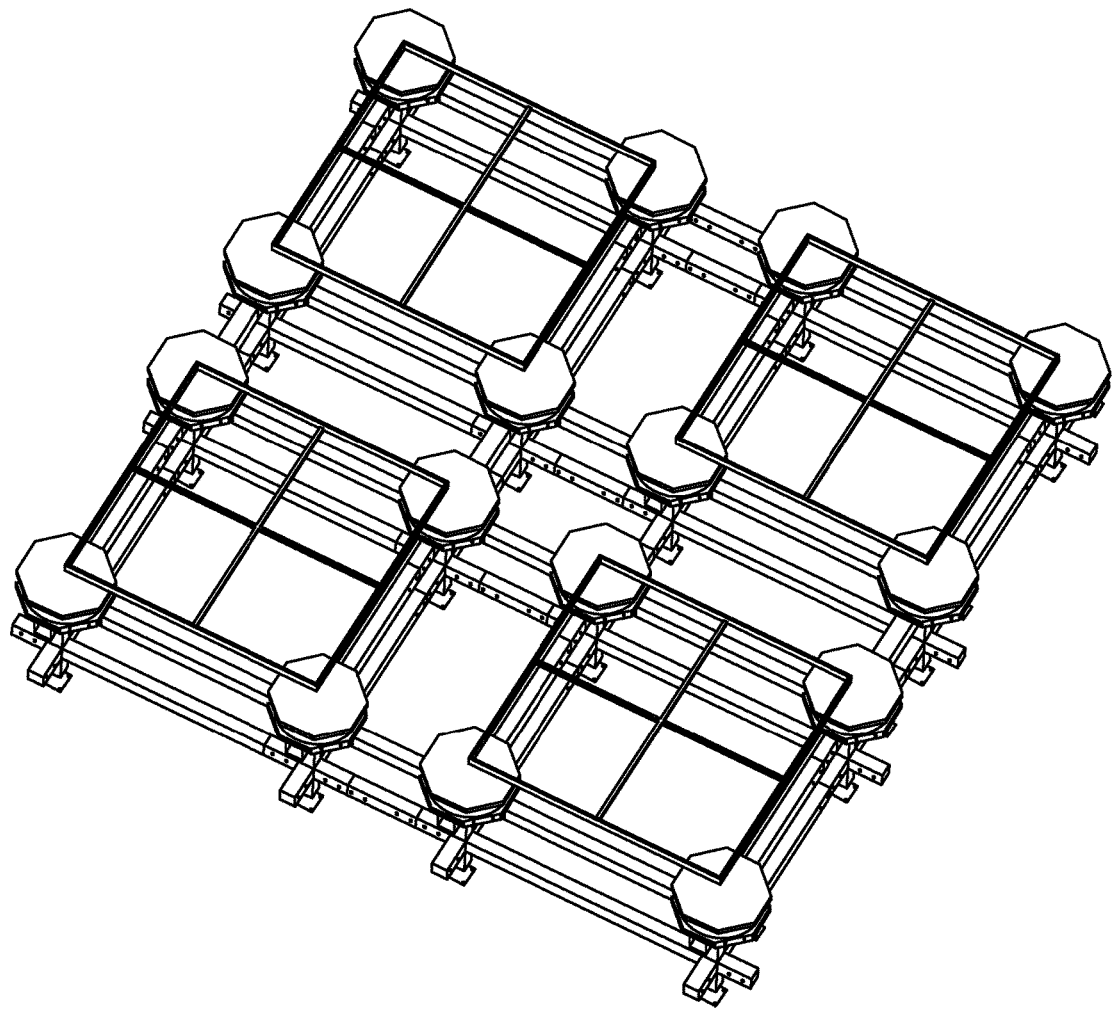
FIG. 17 shows a perspective rendering of four linked, but independently movable four-isolator equipment stands made from modular seismic support units and components as shown in FIG. 14 and FIG. 12A to FIG. 12F, the support platforms are shown in transparent view.
Figure 18:
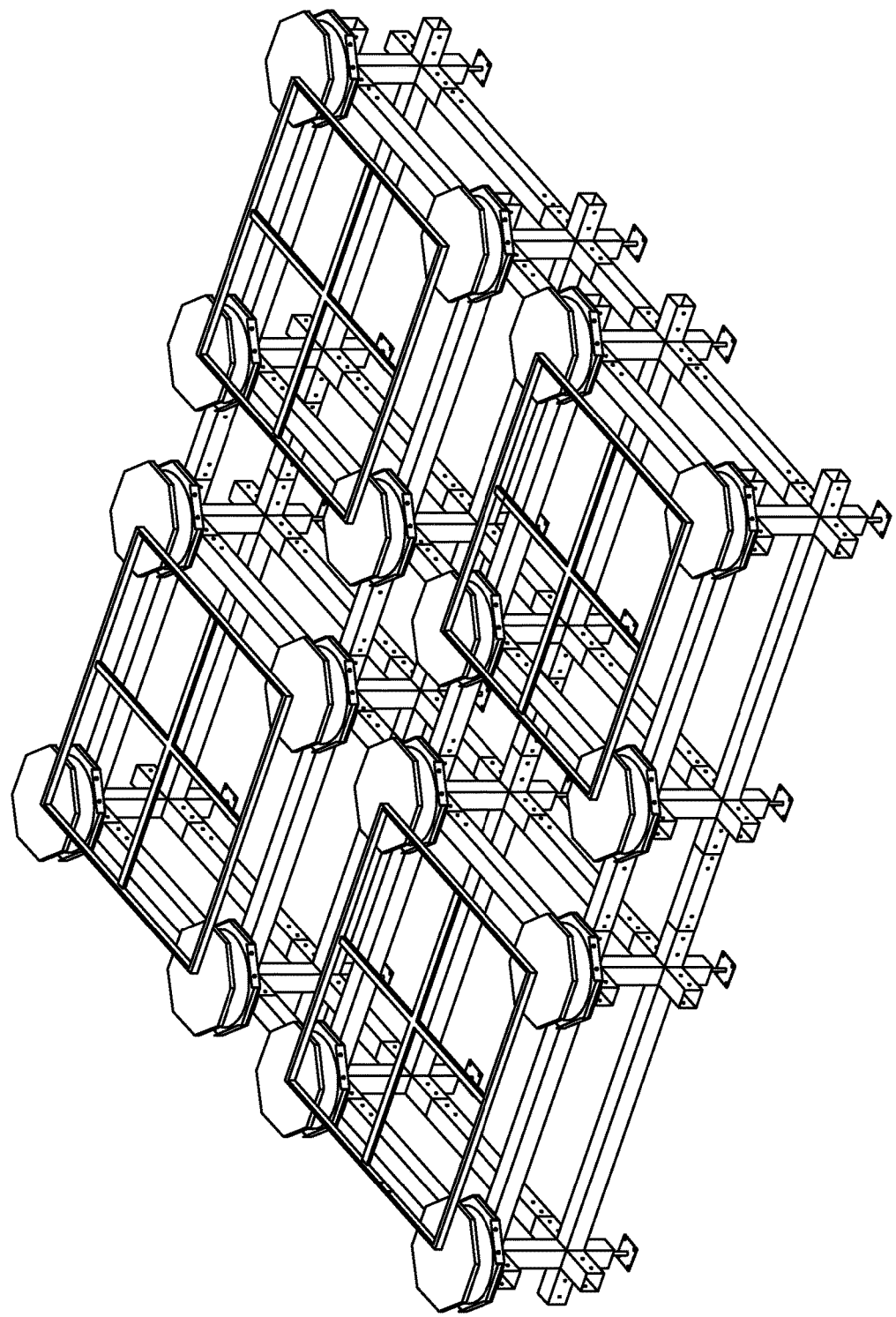
FIG. 18 is another perspective view of the four linked, but independently movable four-isolator equipment stands shown in FIG. 17.
Figure 19:
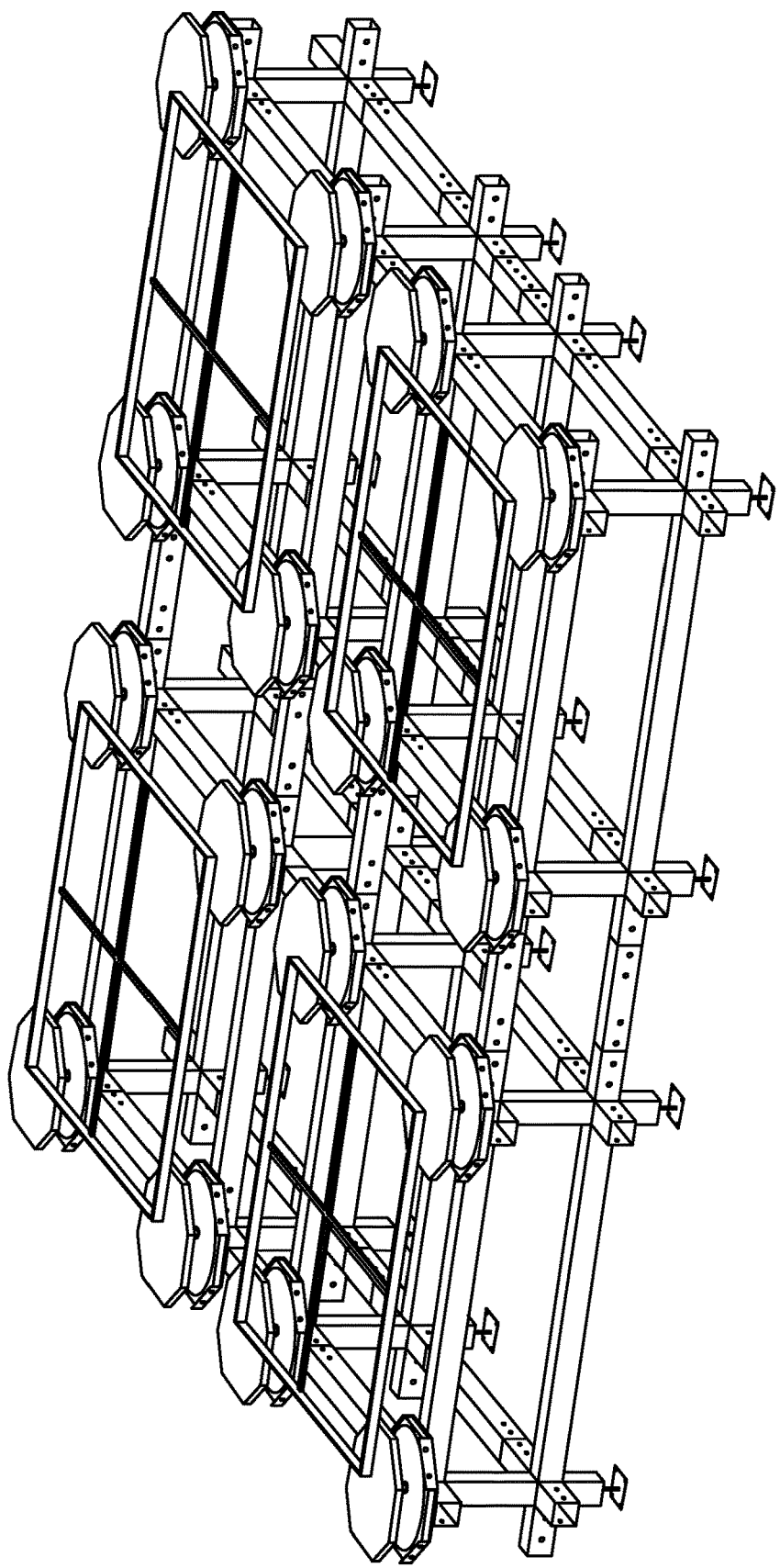
FIG. 19 is yet another perspective view of the four linked, but independently movable four-isolator equipment stands shown in FIG. 17 and FIG. 18.
Figure 20:
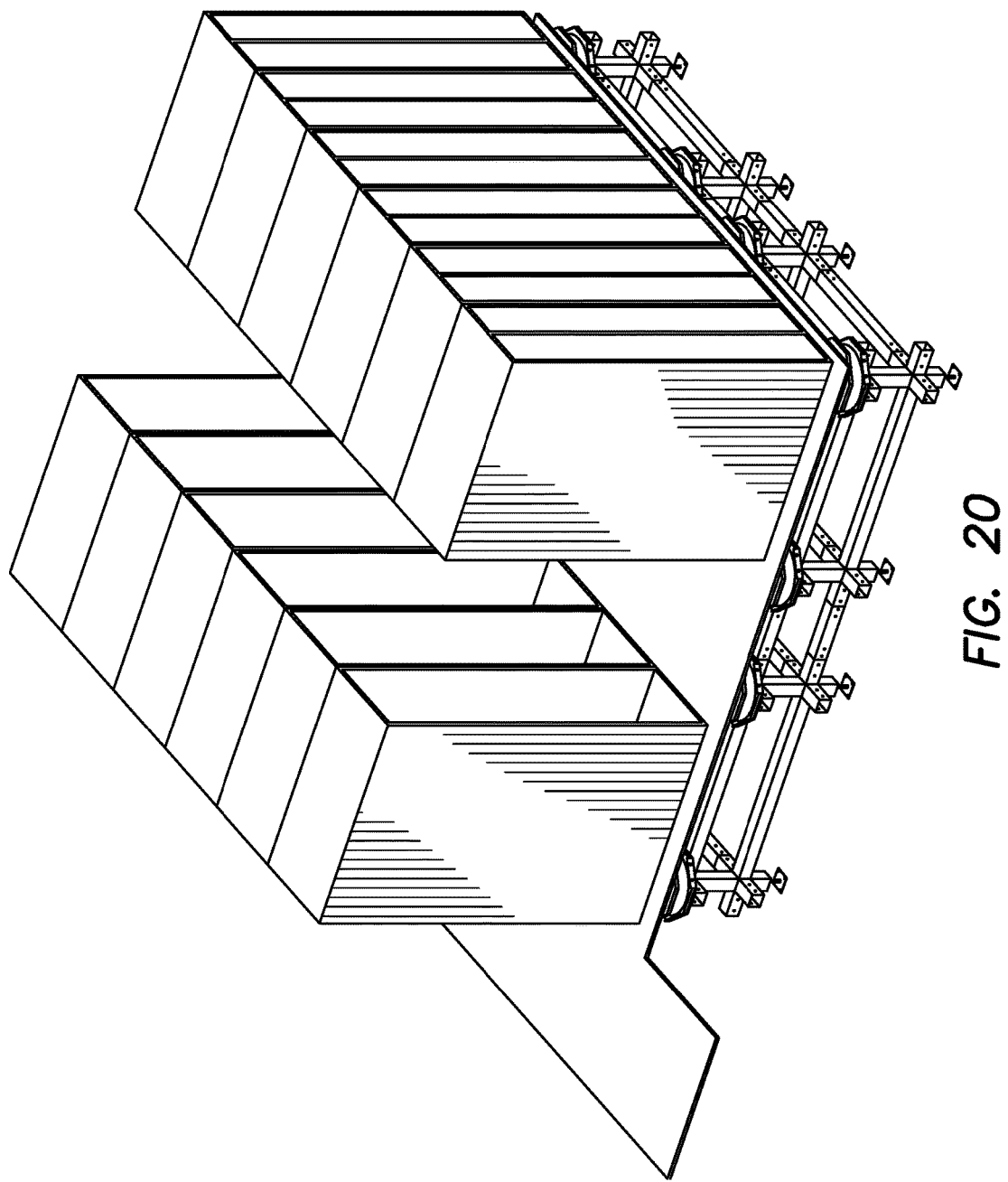
FIG. 20 is a perspective view of a portion of a data center comprising IT equipment racks placed to oppose each other, thereby forming an aisle, and supported on a support platform or floor placed upon a four-isolator linked modular seismic isolation support as shown in FIGS. 17-19.
Figure 21:
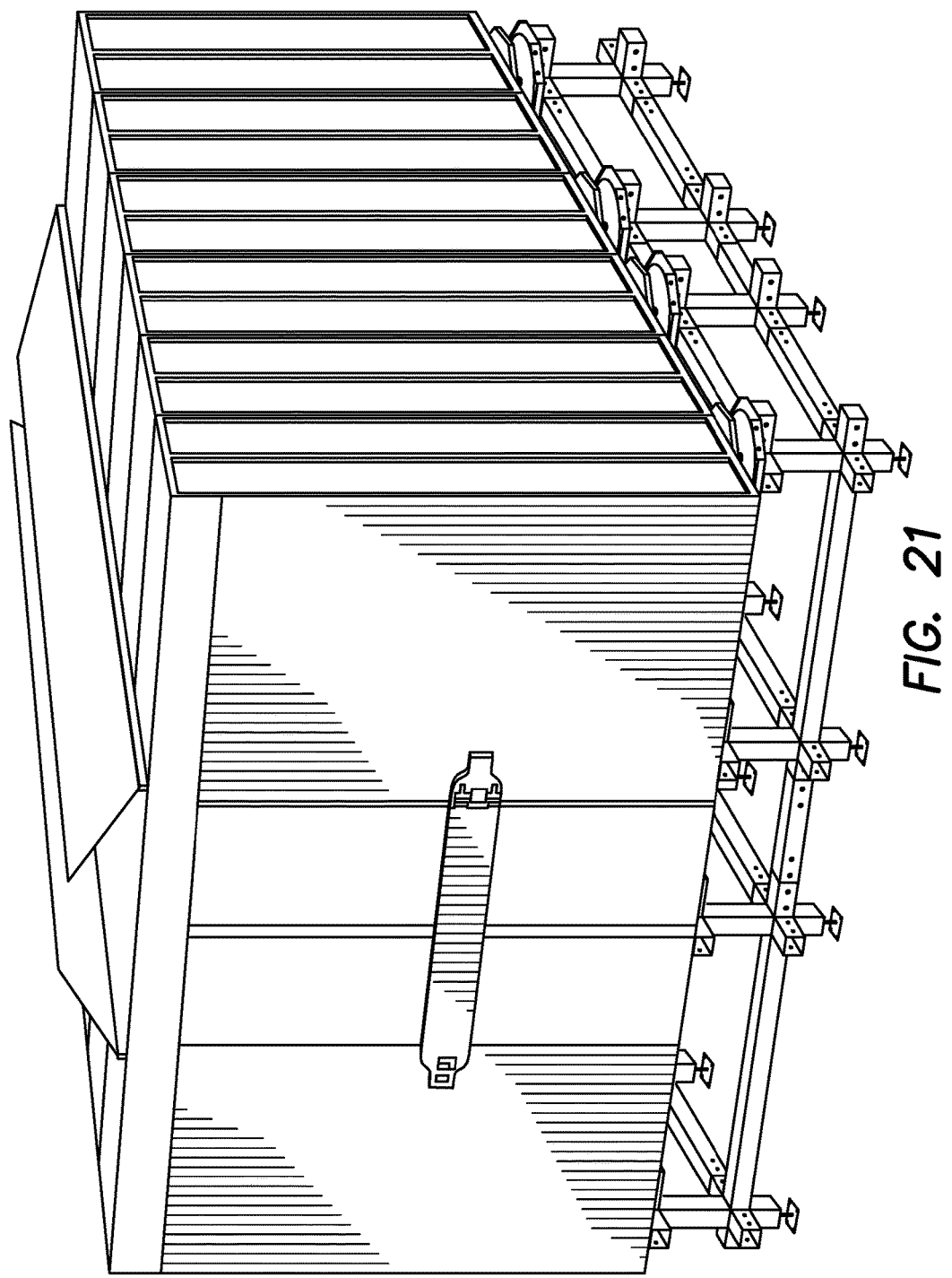
FIG. 21 shows a perspective view of a portion of a data center comprising IT equipment racks placed to oppose each other, thereby forming an aisle, and supported on a support platform or floor placed upon a four-isolator linked modular seismic isolation support as shown in FIGS. 17-19. In this example, the aisle has an openable roof and door.

In other examples, the modular support units of the present invention are further structured to hold one or more seismic isolators on or near the top of each such unit. When the isolator is a "rolling ball" or "rolling member" type isolator the term "isolator" is meant to include a top and bottom load-bearing surfaces with one or more rolling member sandwiched between. FIGS. 10A, 10B and 14 show a modular support unit having two sets of isolator mounting brackets on an upper horizontal connector, where the vertically extending connectors join the upper horizontal connector. In FIG. 14 two isolator mounts comprising a mounting platform and mounting brackets are shown, each structured to hold an octagonal rolling ball isolation bearing.

In such examples, a plurality of such modular support units may be interconnected to form a raised seismic isolation rack or support, or a raised seismic isolation floor. Seismic isolation flooring may advantageously be designed to connect directly with the walls of the facility in which the equipment is housed without the need for a gap permitting a full range of motion to be maintained around the perimeter of the system. Instead, the isolators can be mounted on the top of the network of horizontal and vertically extending connectors sufficiently to permit the creation of one or more seismically isolated "islands", suitably spaced to the interior of the perimeter of the flooring system to permit the isolators a full range of motion during a seismic vibration. It will be clear that in such examples of the invention, the network of horizontal and vertically extending connectors is not seismically isolated; only the payload(s) which are supported on the seismically isolated islands are isolated.

An advantage of such a system is the elimination of the substantial risk of personal injury posed by "moated" seismic flooring systems in which the entire floor moves during a seismic event. Since most seismic events occur without warning, a person walking or standing beside a traditional moated seismic flooring system when a tremor happens is at risk of severe injury or death if the seismic floor (bearing heavy equipment and having an inertia substantially equal to the mass of the payload) moves relative to the floor or foundation upon which the person is standing.

It should be noted that in the present invention a space should still be left between seismically isolated islands as well as between the edge of an island and the perimeter of the floor or support of the present invention; this space should be approximately the radius of the isolator or greater.

Because of the flexibility of the modular design of the present invention, the raised seismic isolation supports and seismic isolation floors may easily and quickly be altered as new equipment is added or altered, or can be reconfigured as necessary to fit changes or additions to the facility space.

In most examples the top surface of the top bearing half of each isolator is designed to be raised only slightly (e.g., about 4 inches or less, or about 3 inches or less or about 2 inches or less) above the upper surface of the topmost horizontal connectors of the seismic support or floor.

The present invention is also drawn in other examples to methods of seismically isolating a payload, and to data center configurations comprising one or both of a hot aisle and a cold aisle and equipment supports (such as seismically isolated equipment supports for the IT-related equipment contained therein.

Examples

Figure 1A:
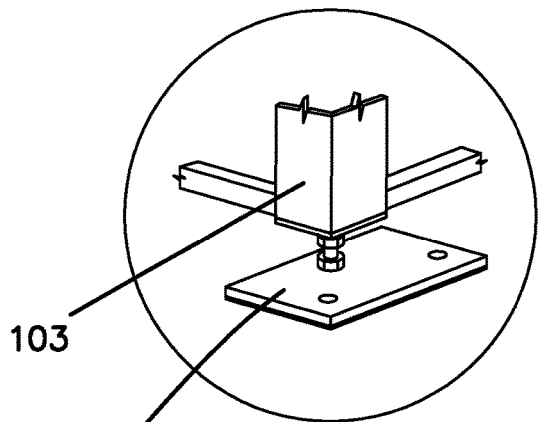
FIG. 1A is a closeup view of the foot plate assembly of the equipment stand shown in FIG. 1.
Figure 1B:
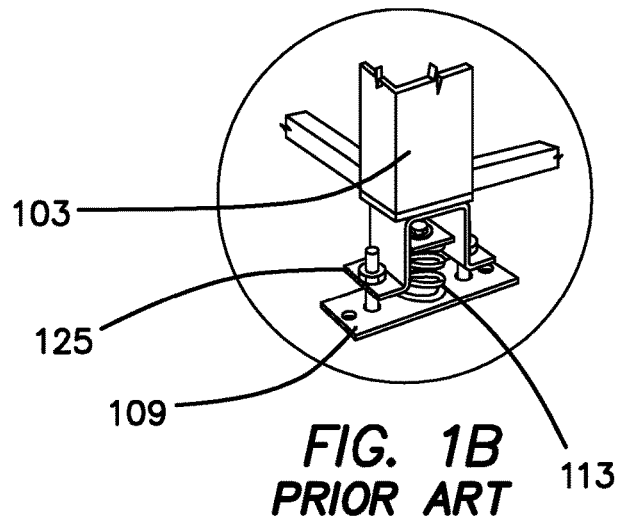
FIG. 1B is a closeup view of an alternative embodiment of the foot plate assembly of the equipment stand shown in FIG. 1.
Figure 1C:
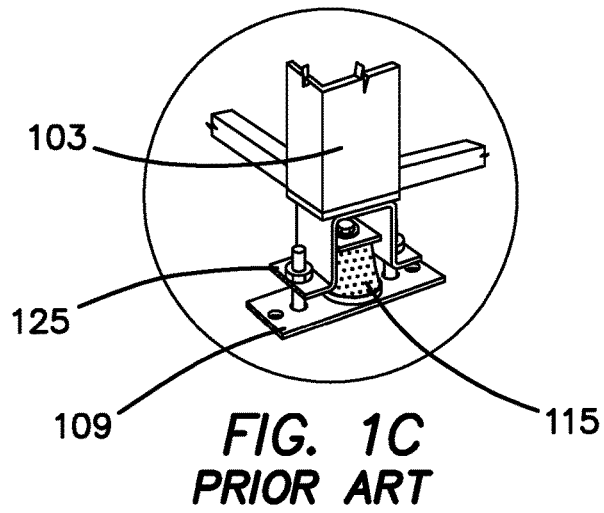
FIG. 1C is a closeup view of an alternative embodiment of the foot plate assembly of the equipment stand shown in FIG. 1.

FIG. 1 is drawn to an example of a prior art seismically protective equipment stand 101. The equipment stand comprises L-shaped shaped corner supports 109 and a pair of intermediate supports 117 made from steel plate. The top and bottom perimetric frames (105 and 107, respectively) and the framework components 119, 121 providing internal support, are made of thinner steel framing material. The corner supports 103 and intermediate supports 117 are fastened to this framing material and to the floor via padded foot plates 109. The foot plates 109 are, in turn anchored into the floor using anchor bolts 125 (FIG. 1A); in some examples, a spring 113 (FIG. 1B) or elastomeric material 115 (FIG. 1C) may provide dampening against payload damage due to seismic vibrations. The feet can be leveled, i.e. during or after installation, using threaded leveling screws or bolts 123.

Figure 2:
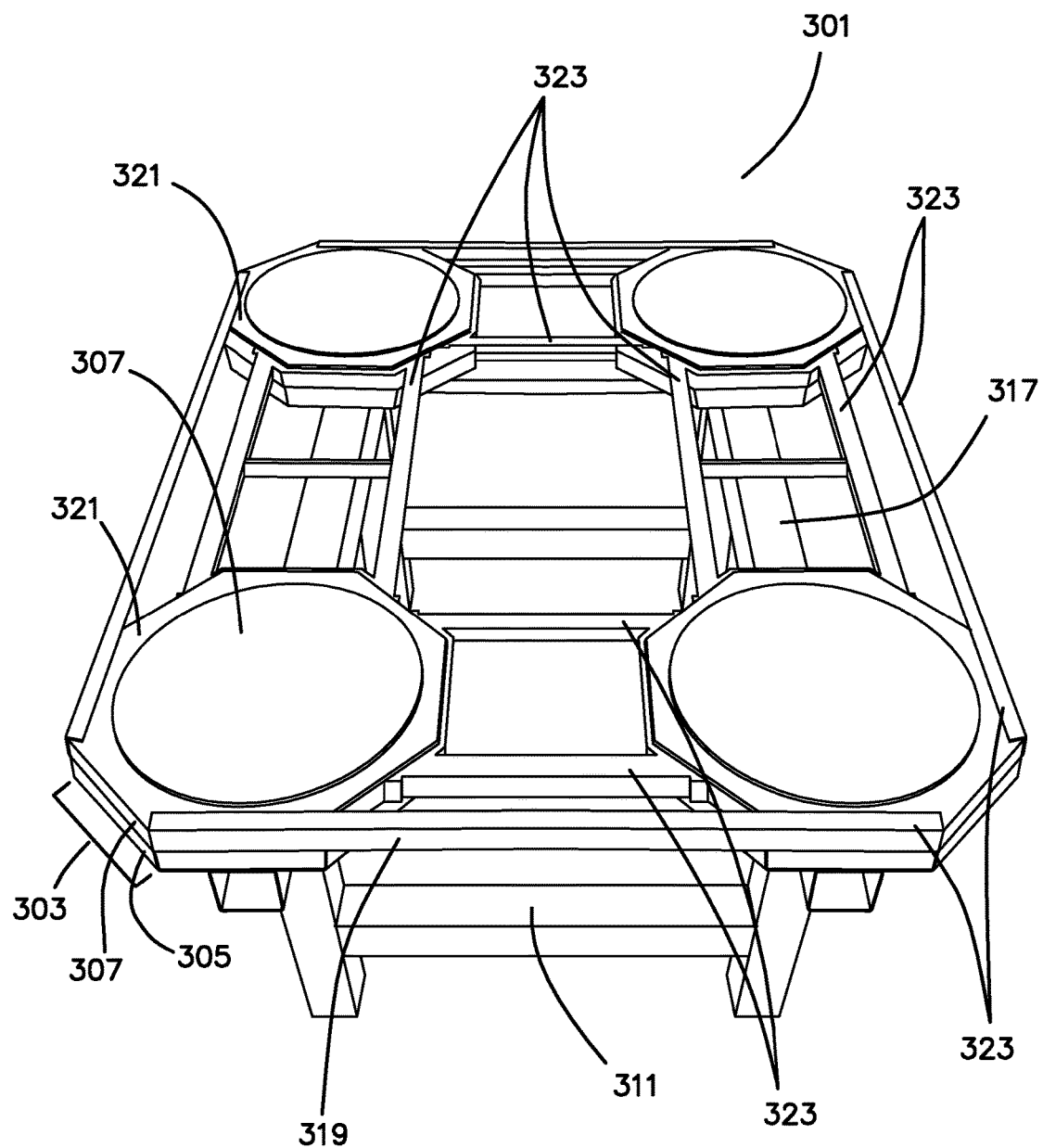
FIG. 2 is a top view of one example of a four-isolator version of the seismic isolation support of the present invention.
Figure 3:
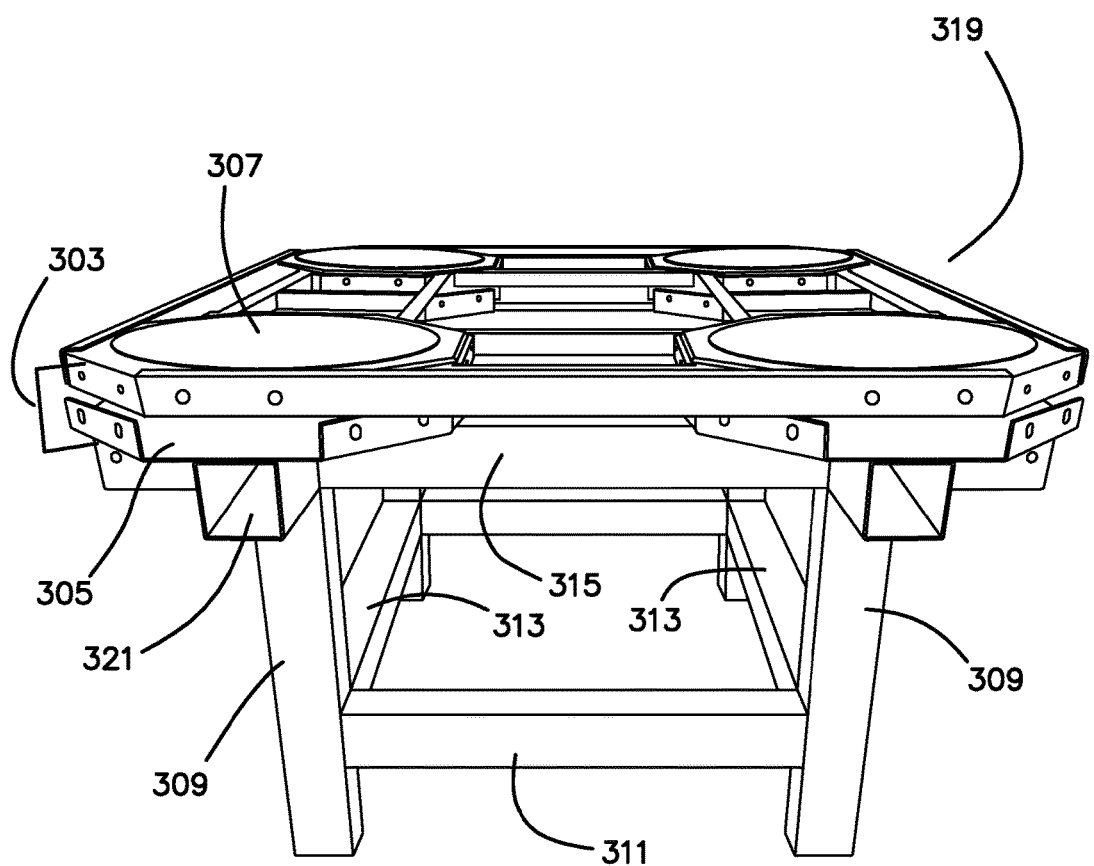
FIG. 3 is a slightly elevated front view of the four-isolator seismic isolation support shown in FIG. 2.

FIG. 2 is a raised top view of one example of a four-isolator equipment stand 301 of the present invention; FIG. 3 a lower elevation of the same example. The equipment stand comprises four rolling ball isolators 303 comprising a lower bearing half 305 joined to the framework components of the equipment stand below, and an upper bearing half 307, both of which are surrounded by an octagonal frame 321. The frame 321 of each upper bearing half 307 is firmly secured to the framework components 323 of platform 319. A rolling ball (not shown) is sandwiched between upper bearing half 307 and lower bearing half 305, permitting free movement of the platform 319 and upper isolator bearing half 307, relative to the lower isolator bearing half 305.

The framework components of the lower portion of the equipment stand comprise lower front and rear horizontal connectors 313, lower lateral horizontal connectors 311, vertically extending connectors 309, upper lateral horizontal connectors 315 and upper front and rear 317 horizontal connectors.

Figure 4:
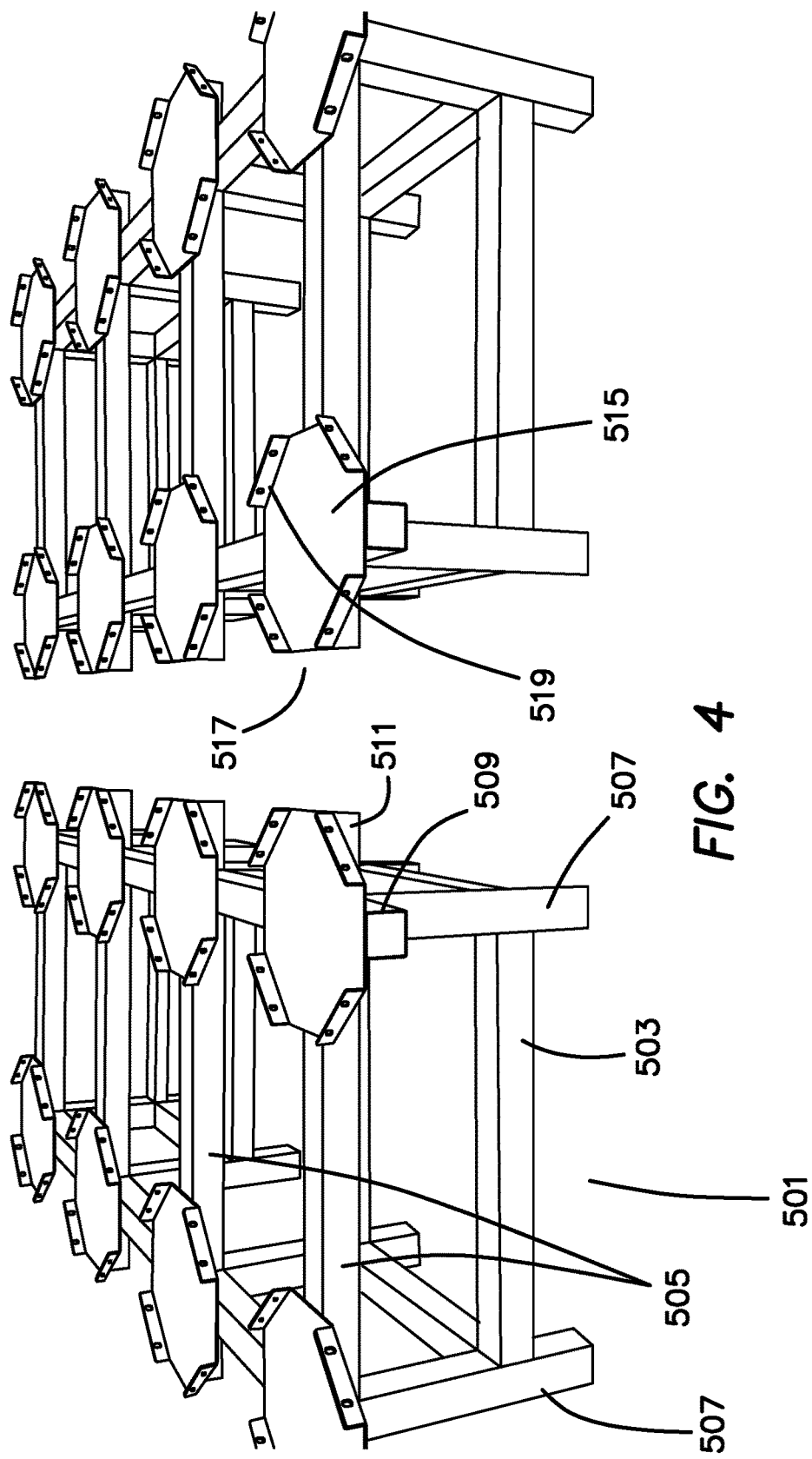
FIG. 4 is an elevated front view of four seismic isolation supports of the present invention arranged in two rows.
Figure 5:
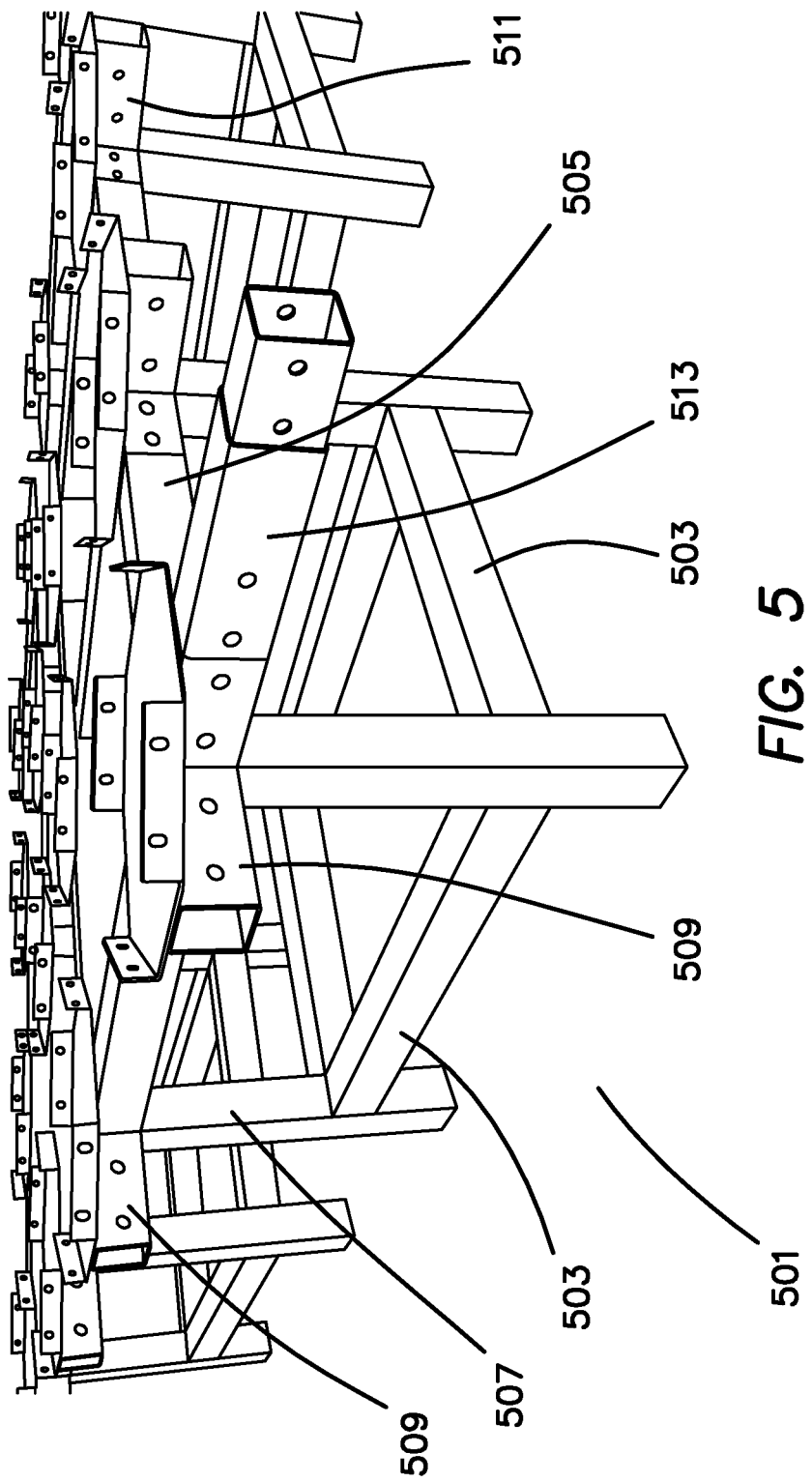
FIG. 5 is a slightly elevated view of the four seismic isolation supports shown in FIG. 4 from a corner of one of the two rows.

FIG. 4 and FIG. 5 shows an example of a plurality of 4-isolator modular support units 501 of the present invention, in which the isolators and upper platform are not shown. These units comprise lower horizontal connectors 503 and upper horizontal connectors 505, each arranged in a rectangle, with vertically extending connectors 507 at each corner thereof.

Figure 6:
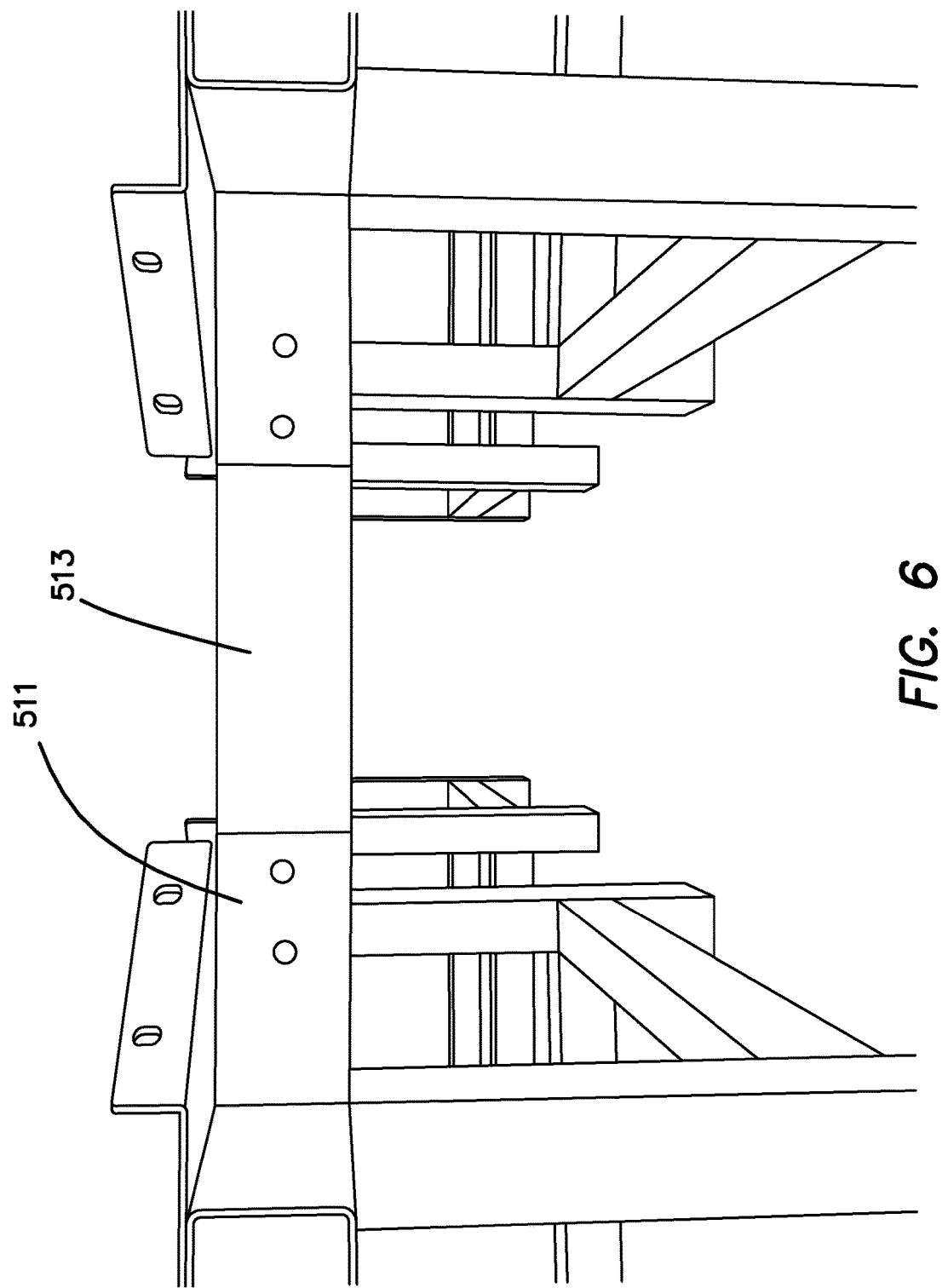
FIG. 6 is a view showing a cross support member joining 2 four-isolator seismic isolation supports at a 180° angle.

Front and back mating components 509 and lateral mating components 511 are also shown; these mating components comprise extensions of the upper horizontal connectors 505, which in this example are comprised of hollow square steel tubing, and are arranged at 90° angles to each other. Also shown in FIG. 5 and FIG. 6 is one aisle base connector 513 connected to a lateral mating component 511, and configured to attached to an adjoining modular support unit.

Isolator mounts 517 to fit the lower bearing half of a rolling ball isolator are joined to the top surface of the modular support unit where the upper horizontal connectors and the vertically extending connectors meet. Each set of isolator mounts may comprise a mounting platform 515 and mounting brackets 519.

Figure 7:
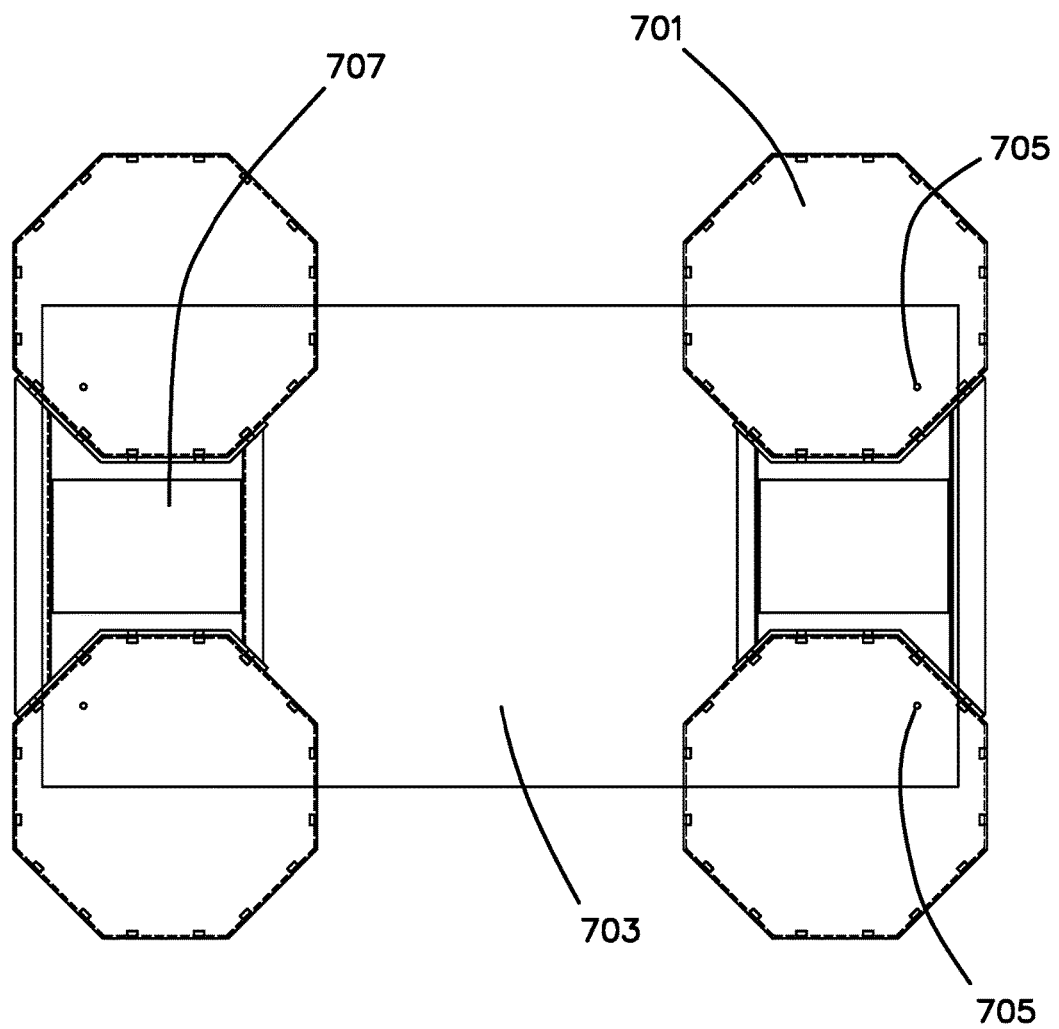
FIG. 7 is a top view showing another example of the seismic isolation support of the present invention comprising 2 separate two-isolator modular support units bridged and joined by a sheet component to make a stable four-isolator seismic equipment platform. In this view the lower isolator frame is shown, but the isolator bearing itself is not.
Figure 8:
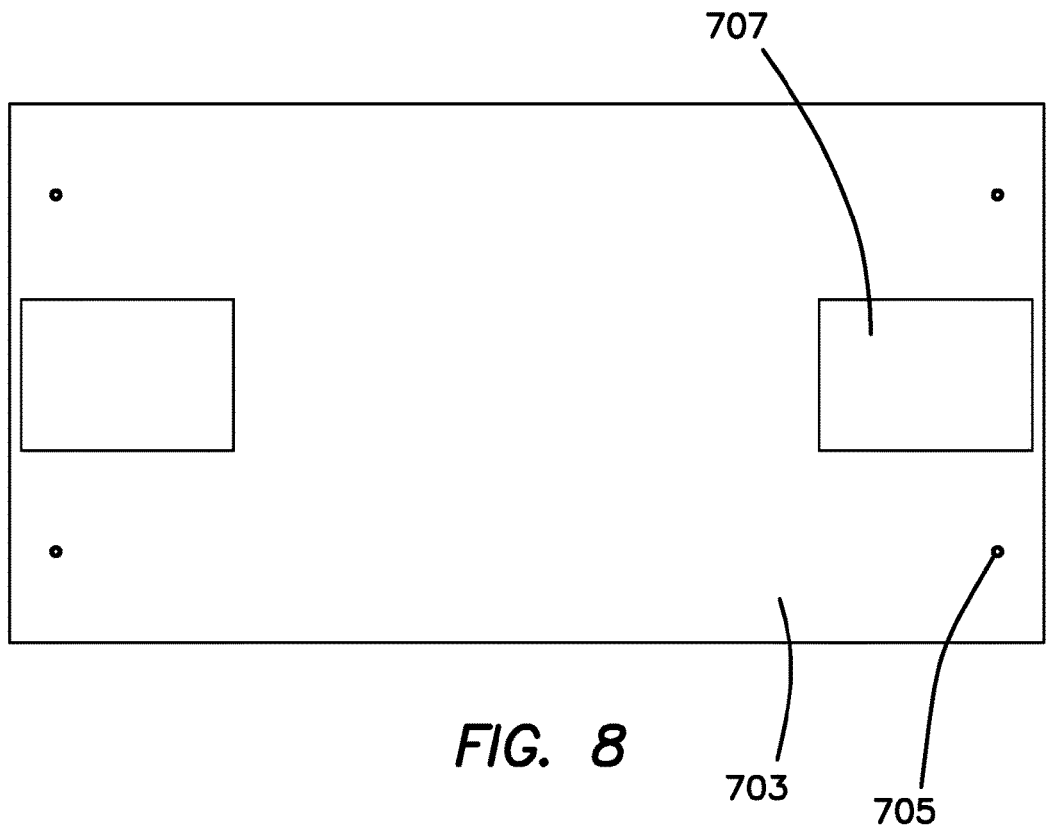
FIG. 8 is a detailed top view of the sheet component depicted in FIG. 7.

FIG. 7 shows another example of the present invention, in which the arrangement of 4 isolator top bearing halves 701, connected with a support platform 703 is depicted. The support platform 703 is comprised in this example of ⅛ inch steel flat plate, having holes (such as tapped screw holes or bolt holes) 705 by which the support platform is joined to the isolators. The steel plate is also fabricated with a square cutout 707 through which service lines, conduit, cables and wire can be run from the equipment payload under the raised stand or floor.

Figure 9:
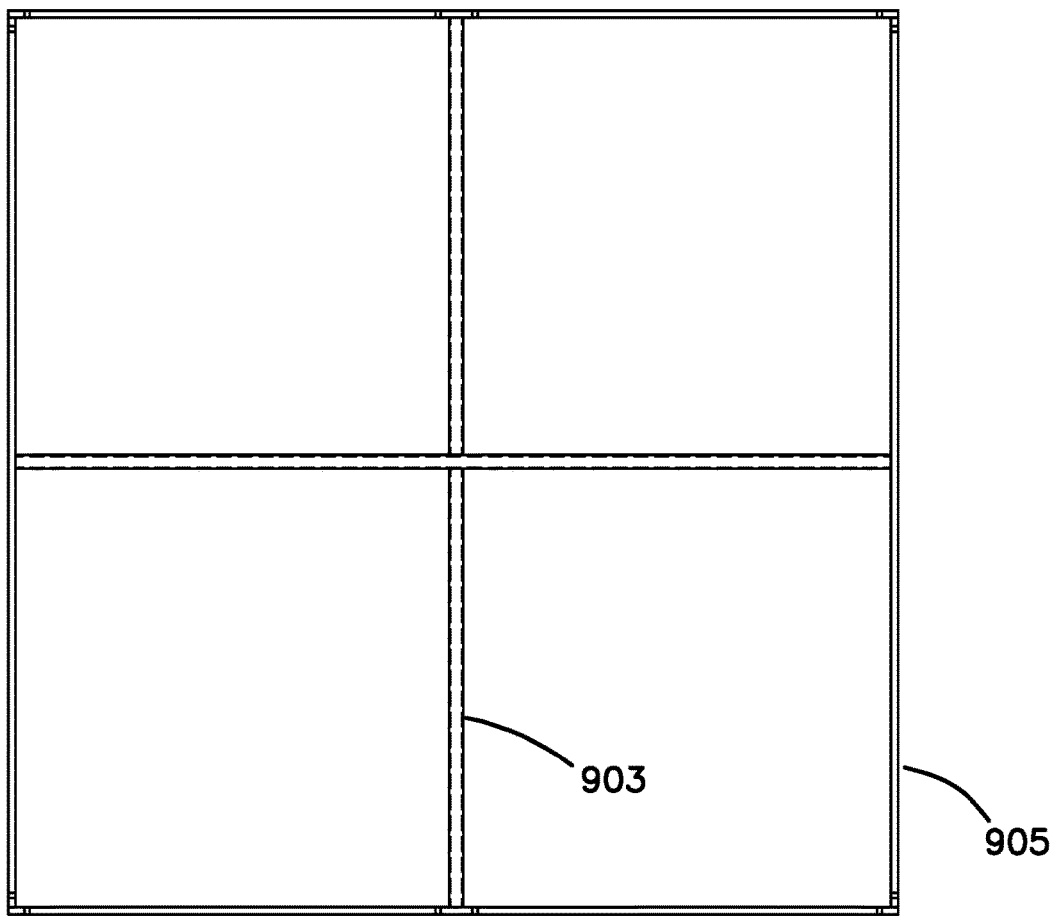
FIG. 9 is a detailed top view of a "4 tile-sized" flooring frame for use with the seismic isolation floors of the present invention.
Figure 12A:
FIG. 12A is a top view of a 48-inch aisle base stand connector, used to connect modular seismic support units together.
Figure 12B:
FIG. 12B is a side view of a 48-inch aisle base stand connector, used to connect modular seismic support units together.
Figure 12C:
FIG. 12C is a top view of a 33-inch aisle base stand connector, used to connect modular seismic support units together.
Figure 12D:
FIG. 12D is a side view of a 33-inch aisle base stand connector, used to connect modular seismic support units together.
Figure 12E:
FIG. 12E is a side view of a 15-inch aisle base stand connector, used to connect modular seismic support units together.
Figure 12F:
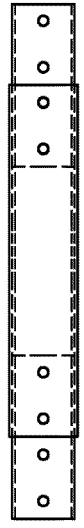
FIG. 12F is a side view of a 15-inch aisle base stand connector, used to connect modular seismic support units together.
Figure 13:
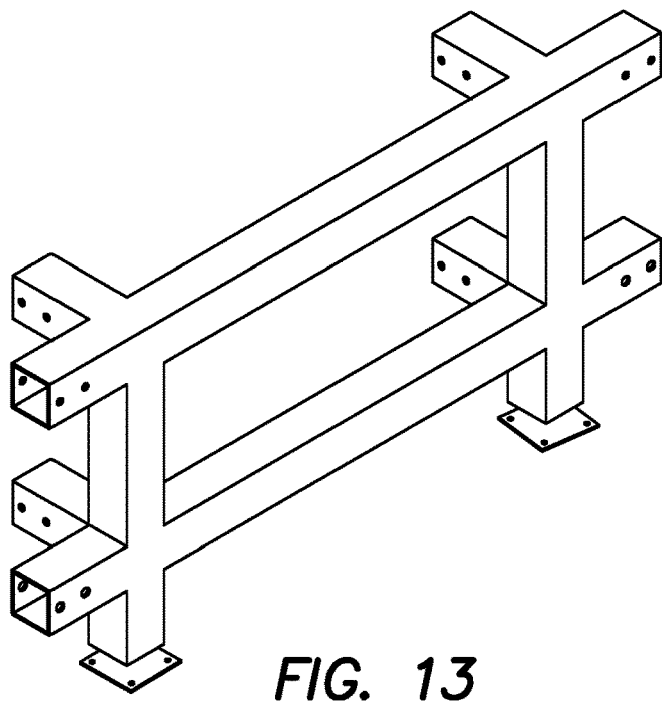
FIG. 13 is a perspective rendering of the "front" of the modular support end unit shown in FIGS. 11A, 11B and 11C and FIG. 14.

FIG. 9 is a top view of another support platform, in the shape of a frame 901. This frame, comprising an outer rectangular perimeter 905 and interior cross supports 903, can be made of smaller gauge square steel tubing or similar strong frame material. This frame is designed to fit over four isolators and to fit up to four standard flooring tiles, which can be placed and secured within the frame.

FIGS. 10A, 10B and 10C are side, rear, and top views, respectively, of a two isolator modular seismic support unit 1001, depicting the lower assembly without the isolators or top support platform or frame. Such a support unit is suitable to form part of a raised seismically isolated equipment rack or a raised seismic isolation floor. The assembly comprises a lower horizontal connector 1003, an upper horizontal connector 1005, two vertically extending connectors 1007, four lateral mating components 1009 (two on each of the upper and lower horizontal connectors), and eight front or back mating components 1011 (four on each of the upper and lower horizontal connectors). In this example, all of the connectors and mating components are made using hollow square steel tubing.

Additionally, FIGS. 10A, 10B and 10C show that the modular seismic support unit 1001 comprises two isolator mounts which comprise a mounting platform 1015 and mounting brackets 1013. It is important to note that in this example the lower assembly depicted is not seismically isolated, and will generally move with the floor or building foundation.

FIGS. 11A, 11B and 11C show a modular support "end" unit 1101 structured to connect to another modular seismic support unit, such as the one depicted in FIGS. 10A-10C on e.g., the "back" side, and have no corrections on the front side. This "end" unit has no seismic isolator mounts and while having a lower horizontal connector 1103, an upper horizontal connector 1105, two vertically extending connectors 1107, and four lateral mating components 1109 (two on each of the upper and lower horizontal connectors), has only four back mating components 1111 (two on each of the upper and lower horizontal connectors), and no front mating components.

Terminating a row of assembled modular seismic support units with this "end" unit would assure that the seismic isolation islands created by the present seismic floor and support systems would have room to freely move at a level above ground level. This would permit a person to stand next to the seismic floor or support assembly without fear of injury by a seismic shock causing the assembly to move in response thereto.

FIG. 12A-12F show various views of aisle base stand connectors, which are structured to be inserted into upper and lower mating components. These aisle base stand connectors have at least one end, and preferably two, that is structured to slide within the hollow mating component of the modular seismic support units, thereby connecting two such units together.

FIG. 13-21 are additional views of the components of a modular raised seismic isolation floor similar to that shown in FIG. 9-FIG. 11, as well as of a section of the assembled floor, with a payload and an aisle between two payload sections.

The foregoing examples are simply for the purpose of illustration of various manufactures incorporating elements disclosed in the present specification. To the extent that a plurality of inventions may be disclosed herein, any such invention shall be understood to have disclosed herein alone, in combination with other features or inventions disclosed herein, or lacking any feature or features not explicitly disclosed as essential for that invention. For example, the inventions described in this specification can be practiced within elements of, or in combination with, other any features, elements, methods or structures described herein. Additionally, features illustrated herein as being present in a particular example are intended, in other examples of the present invention, to be explicitly lacking from the invention, or combinable with features described elsewhere in this patent application, in a manner not otherwise illustrated in this patent application or present in that particular example. The scope of the invention shall be determined solely by the language of the claims.

Thus, the various descriptions of the invention provided herein illustrate presently preferred examples of the invention; however, it will be understood that the invention is not limited to the examples provided, or to the specific configurations, shapes, and relation of elements unless the claims specifically indicate otherwise. Based upon the present disclosure a person of ordinary skill in the art will immediately conceive of other alternatives to the specific examples given, such that the present disclosure will be understood to provide a full written description of each of such alternatives as if each had been specifically described.

Claim terms shall be intrinsically defined not only by a specific definition in the specification, but also with reference to the Figures as understood by a person of ordinary skill in the art in light of the present disclosure.

Every publication and patent document cited herein is each hereby individually incorporated by reference in its entirety for all purposes to the same extent as if each were so individually denoted.

The invention claimed is:

1. A method of seismically isolating a payload, comprising:
   placing said payload on a support platform of a modular seismic isolation system wherein the modular seismic isolation system comprises:
   a) a first modular support unit comprising a lower horizontal connector having two lateral mating components and two front or back mating components, an upper horizontal connector having two lateral mating components and two front or back mating components, and two vertically extending connectors joined to upper and lower horizontal connectors;
   b) a second modular support unit identical to the first modular support unit,
   c) at least one aisle base connector releasably joined to a mating component of said first modular support unit and a mating component of said second modular support unit;
   d) two rolling member seismic isolators fastened to a top surface of the upper horizontal connector of said first modular support unit; and supporting
   e) said support platform.

2. The method of claim 1 wherein the modular raised support system comprises three or more modular support units, wherein the total number of vertically extending connector components is four or more.

3. The method of claim 2 wherein the modular raised support system is a raised seismic platform composition.

4. The method of claim 1 wherein the modular raised support system comprises an aisle base connector structured to releasably lock within said mating component.

5. The method of claim 1 wherein the modular raised support system comprises:
   a) a first modular support unit comprising
      a lower horizontal connector having two lateral mating components and two front or back mating components,
      an upper horizontal connector having two lateral mating components and two front or back mating components, and
      two vertically extending connectors joined to upper and lower horizontal connectors;
   b) a second modular support unit identical to the first modular support unit, and at least one aisle base connector releasably joined to a mating component of said first modular support unit and a mating component of said second modular support unit.

6. The method of claim 1 wherein the modular raised support system comprises two rolling member seismic isolators fastened to a top surface of the upper horizontal connector of said first modular support unit, and to said support platform.

7. The method of claim 1 wherein the modular raised support system comprises two rolling member seismic isolators comprising a lower bearing half, an upper bearing half, and a rolling member between said bearing halves, wherein said lower bearing half is fastened to a top surface of the upper horizontal connector of said first modular support unit, and said upper bearing half is joined to a support frame structured to support flooring tiles.

8. The method of claim 1 wherein the modular raised support system is a raised seismic floor composition.

9. A method of seismically isolating a payload, comprising: placing said payload on a modular raised support system, wherein the modular raised support system comprises
   a) a plurality of modular support units, each said modular support unit connected to a neighboring modular support unit by a lower assembly comprising
      i) one or more horizontal connector component;
      ii) one or more vertically extending connector component;
      iii) at least one lateral mating component;
      iv) a component selected from the group consisting of a front mating component and a back mating component;
   wherein each said one or more horizontal connector component is joined to at least one vertically extending connector component, and each modular support unit comprises two or more rolling member seismic isolators directly or indirectly fastened to a top surface of an upper horizontal connector thereof,
   wherein said lateral mating component and the component of subparagraph iv) are configured to mate together.

10. The method of claim 9 wherein at least one of said lateral mating component and the component of subparagraph iv) comprises a hollow tube.

11. The method of claim 9 wherein the payload is selected from the group consisting of IT racks, server cabinets, computer-related equipment; electrical equipment: hazardous chemicals; art works; machinery; and personnel.

12. A computing center comprising:
   one or more computing equipment racks supported on a raised seismic isolation floor; said raised seismic isolation floor comprising
      at least two modular seismic support units, each said modular seismic support unit comprising an upper horizontal connector, a lower horizontal connector and at least two vertically extending connectors, and at least four mating components selected from the group consisting of: two upper front mating components and two lower front mating components, and two upper back mating components and two lower back mating components;
      at least four aisle base stand connectors, each said aisle base stand connector structured to be inserted into upper or lower mating components of each modular seismic support unit thereby joining the modular seismic support units to each other to form a first cuboidal structure;
      at least two rolling member seismic isolators mounted to a top surface of each of the at least two modular support units, and
      a support platform, joined to the rolling member seismic isolators, upon which said one or more computing equipment racks rest.

13. The computing center of claim 12 wherein at least one of said modular seismic support units has at least eight mating components comprising: two upper front mating components, two upper back mating components, two lower front mating components, and two lower back mating components.

14. The computing center of claim 12 wherein said at least two modular seismic support units comprises two upper lateral mating components and two lower lateral mating components.

15. The computing center of claim 12 comprising two rows of computing equipment racks with an aisle between the rows.

16. The computing center of claim 15 further comprising at least one modular support "end" unit having a lower horizontal connector, an upper horizontal connector, and two vertically extending connectors, and lacking either front or back four mating components.

17. The computing center of claim 12 further comprising at least two additional modular seismic support units, each said modular seismic support unit comprising
   an upper horizontal connector, a lower horizontal connector and at least two vertically extending connectors, and at least four mating components selected from the group consisting of: two upper front mating components and two lower front mating components, and two upper back mating components and two lower back mating components;
   at least four aisle base stand connectors, each said aisle base stand connector structured to be inserted into upper or lower mating components of each modular seismic support unit thereby joining the modular seismic support units to each other to form a second cuboidal structure;
at least two rolling member seismic isolators mounted to a top surface of each of the additional at least two modular support units, and
   wherein the modular support units comprising the first cuboidal structure and the modular support units comprising the second cuboidal structure each comprise at least two upper lateral mating components and at least two lower lateral mating components by which lateral mating components said first cuboidal structure is joined to said second cuboidal structure by at least four aisle base stand connectors.

* * * * *